US012477932B2

(12) United States Patent
Du et al.

(10) Patent No.: US 12,477,932 B2
(45) Date of Patent: Nov. 18, 2025

(54) DISPLAY SUBSTRATE AND PREPARATION METHOD THEREOF, AND DISPLAY APPARATUS EACH INCLUDING PARTITION REGION PROVIDES WITH AT LEAST ONE PARTITION DAM SURROUNDING FUNCTION HOLE

(71) Applicants: Chengdu BOE Optoelectronics Technology Co., Ltd., Sichuan (CN); BOE Technology Group Co., Ltd., Beijing (CN)

(72) Inventors: Nan Du, Beijing (CN); Guowei Su, Beijing (CN); ChiehHsing Chung, Beijing (CN); Yongyi Fu, Beijing (CN); Yong Zhou, Beijing (CN); Feng Bai, Beijing (CN); Saijun Sun, Beijing (CN); Kaihao Chen, Beijing (CN); Suoping Peng, Beijing (CN); Kechao Song, Beijing (CN); Zhengping Xu, Beijing (CN); Sa Liu, Beijing (CN); Hexiong Li, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/913,172

(22) PCT Filed: Nov. 29, 2021

(86) PCT No.: PCT/CN2021/134057
§ 371 (c)(1),
(2) Date: Sep. 21, 2022

(87) PCT Pub. No.: WO2023/092566
PCT Pub. Date: Jun. 1, 2023

(65) Prior Publication Data
US 2024/0224716 A1 Jul. 4, 2024

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC .................. H10K 59/873; H10K 59/1201
See application file for complete search history.

(56) References Cited

U.S. PATENT DOCUMENTS

2019/0081273 A1 3/2019 Sung et al.
2020/0194714 A1* 6/2020 Won .................. H10K 59/8731
(Continued)

FOREIGN PATENT DOCUMENTS

CN 106887523 A 6/2017
CN 109509769 A 3/2019
(Continued)

OTHER PUBLICATIONS

Office Action dated May 14, 2025 for KR10-2023-7043129 and English Translation.
(Continued)

*Primary Examiner* — Michael Jung
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a display region and at least one hole region located in the display region, the hole region includes a function hole and a partition region surrounding the function hole, the partition region is provided with at least one partition dam surrounding the function hole; the partition dam includes a first partition layer disposed on a base substrate and a second partition layer disposed on a side of the first partition layer (Continued)

away from the base substrate, at least one partition layer includes a second sub-layer and a third sub-layer disposed on a side of the second sub-layer away from the base substrate, the third sub-layer has a protrusion with respect to a sidewall of the second sub-layer, and the protrusion and the sidewall of the second sub-layer form an inwardly recessed structure.

17 Claims, 10 Drawing Sheets

(56) References Cited

U.S. PATENT DOCUMENTS

| | | | |
|---|---|---|---|
| 2020/0251543 | A1 | 8/2020 | Lee et al. |
| 2021/0036197 | A1 | 2/2021 | Noh et al. |
| 2021/0143365 | A1* | 5/2021 | Jo .................. H10K 50/844 |
| 2021/0167149 | A1 | 6/2021 | Zhao et al. |
| 2021/0210723 | A1* | 7/2021 | Han .................. H10K 77/10 |
| 2021/0336214 | A1 | 10/2021 | Bang et al. |
| 2021/0408511 | A1 | 12/2021 | Qin et al. |
| 2022/0069255 | A1* | 3/2022 | You .................. H10K 50/8445 |
| 2022/0199699 | A1* | 6/2022 | Lee .................. G06F 3/0443 |
| 2022/0359632 | A1 | 11/2022 | Yang et al. |
| 2023/0413615 | A1* | 12/2023 | Saitoh .................. H10K 59/88 |

FOREIGN PATENT DOCUMENTS

| | | |
|---|---|---|
| CN | 109802052 A | 5/2019 |
| CN | 109935621 A | 6/2019 |
| CN | 110164945 A | 8/2019 |
| CN | 110246984 A | 9/2019 |
| CN | 110416282 A | 11/2019 |
| CN | 111244112 A | 6/2020 |
| CN | 211929490 U | 11/2020 |
| CN | 112117321 A | 12/2020 |
| IN | 112310117 A | 2/2021 |
| KR | 10-2008-0001263 A | 1/2008 |
| KR | 10-2015-0067974 A | 6/2015 |
| KR | 20200037025 A | 4/2020 |
| WO | 2021227027 A1 | 11/2021 |

OTHER PUBLICATIONS

Office Action dated Jul. 29, 2025 for JP2023-575944 and English Translation.

* cited by examiner

DISPLAY SUBSTRATE AND PREPARATION METHOD THEREOF, AND DISPLAY APPARATUS EACH INCLUDING PARTITION REGION PROVIDES WITH AT LEAST ONE PARTITION DAM SURROUNDING FUNCTION HOLE

CROSS-REFERENCE TO RELATED APPLICATION

The present application is a U.S. National Phase Entry of International Application No. PCT/CN2021/134057 having an international filing date of Nov. 29, 2021, the entire content of which is hereby incorporated by reference.

TECHNICAL FIELD

The present disclosure relates to, but is not limited to, the field of display technologies, and in particular to a display substrate and a preparation method thereof, and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, and a low cost, etc. With continuous development of display technologies, a display apparatus using an OLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

In one aspect, the present disclosure provides a display substrate, which includes a display region and at least one hole region located in the display region, the hole region includes a function hole and a partition region surrounding the function hole, and the partition region is provided with at least one partition dam surrounding the function hole; the partition dam includes a first partition layer disposed on a base substrate and a second partition layer disposed on a side of the first partition layer away from the base substrate, at least one partition layer includes a second sub-layer and a third sub-layer disposed on a side of the second sub-layer away from the base substrate, the third sub-layer has a protrusion with respect to a sidewall of the second sub-layer, the protrusion and the sidewall of the second sub-layer form an inwardly recessed structure.

In an exemplary implementation mode, the at least one partition layer further includes a first sub-layer, and the second sub-layer is disposed on a side of the first sub-layer away from the base substrate.

In an exemplary implementation mode, the first partition layer includes a first conductive sub-layer, a second conductive sub-layer disposed on a side of the first conductive sub-layer away from the base substrate, and a third conductive sub-layer disposed on a side of the second conductive sub-layer away from the base substrate; along a direction away from the function hole, a width of the second conductive sub-layer is smaller than each of widths of the first conductive sub-layer and the third conductive sub-layer, an orthographic projection of the second conductive sub-layer on the base substrate is within each of a range of an orthographic projection of the first conductive sub-layer and a range of an orthographic projection of the third conductive sub-layer on the base substrate, the first conductive sub-layer and the third conductive sub-layer have protrusions with respect to a sidewall of the second conductive sub-layer, and the protrusions and the sidewall of the second conductive sub-layer form an inwardly recessed structure.

In an exemplary implementation mode, the second partition layer includes a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; along the direction away from the function hole, a width of the second metal sub-layer is smaller than each of widths of the first metal sub-layer and the third metal sub-layer, an orthographic projection of the second metal sub-layer on the base substrate is within each of a range of an orthographic projection of the first metal sub-layer and a range of an orthographic projection of the third metal sub-layer on the base substrate, the first metal sub-layer and the third metal sub-layer have protrusions with respect to a sidewall of the second metal sub-layer, and the protrusions and the sidewall of the second metal sub-layer form an inwardly recessed structure.

In an exemplary implementation mode, along the direction away from the function hole, a width of the first metal sub-layer is smaller than a width of the first conductive sub-layer, and an orthographic projection of the first metal sub-layer on the base substrate is within a range of an orthographic projection of the first conductive sub-layer on the base substrate.

In an exemplary implementation mode, along the direction away from the function hole, the width of the second metal sub-layer is smaller than the width of the second conductive sub-layer, and the orthographic projection of the second conductive sub-layer on the base substrate is within a range of an orthographic projection of the second metal sub-layer on the base substrate.

In an exemplary implementation mode, along the direction away from the function hole, a width of the third metal sub-layer is smaller than a width of the third conductive sub-layer, and an orthographic projection of the third conductive sub-layer on the base substrate is within a range of an orthographic projection of the third metal sub-layer on the base substrate.

In an exemplary implementation mode, along the direction away from the function hole, a width of the third metal sub-layer is less than or equal to a width of the first metal sub-layer, and an orthographic projection of the third metal sub-layer on the base substrate is within a range of an orthographic projection of the first metal sub-layer on the base substrate; a width of the third conductive sub-layer is less than or equal to a width of the first conductive sub-layer, and an orthographic projection of the third conductive sub-layer on the base substrate is within a range of an orthographic projection of the first conductive sub-layer on the base substrate; the width of the first metal sub-layer is less than or equal to the width of the third conductive sub-layer, and the orthographic projection of the first metal sub-layer on the base substrate is within a range of the orthographic projection of the third conductive sub-layer on the base substrate.

In an exemplary implementation mode, along the direction away from the function hole, a width of the third metal sub-layer is greater than a width of the first metal sub-layer, and an orthographic projection of the first metal sub-layer on the base substrate is within a range of an orthographic projection of the third metal sub-layer on the base substrate; a width of the third conductive sub-layer is smaller than a width of the first conductive sub-layer, and an orthographic projection of the third conductive sub-layer on the base substrate is within a range of an orthographic projection of the first conductive sub-layer on the base substrate; the width of the first metal sub-layer is equal to the width of the third conductive sub-layer, and the orthographic projection of the first metal sub-layer on the base substrate is substantially overlapped with the orthographic projection of the third conductive sub-layer on the base substrate.

In an exemplary implementation mode, a distance between an edge of the third metal sub-layer and the base substrate is less than a distance between a surface of the second metal sub-layer on a side away from the base substrate and the base substrate.

In an exemplary implementation mode, the second partition layer includes a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; a cross-sectional shape of the second metal sub-layer is a second trapezoid, wherein the second trapezoid includes a second lower bottom on a side close to the base substrate and a second upper bottom on a side away from the base substrate; along the direction away from the function hole, a width of the second upper bottom is smaller than a width of the second lower bottom, an orthographic projection of the second upper bottom on the base substrate is within a range of an orthographic projection of the second lower bottom on the base substrate; a width of the third metal sub-layer is less than or equal to the width of the second upper bottom, and an orthographic projection of the third metal sub-layer on the base substrate is within a range of the orthographic projection of the second upper bottom on the base substrate; the width of the second lower bottom is less than or equal to a width of the first metal sub-layer, and the orthographic projection of the second lower bottom on the base substrate is within a range of an orthographic projection of the first metal sub-layer on the base substrate.

In an exemplary implementation mode, the width of the first metal sub-layer is less than or equal to a width of the third conductive sub-layer, and the orthographic projection of the first metal sub-layer on the base substrate is within a range of an orthographic projection of the third conductive sub-layer on the base substrate.

In an exemplary implementation mode, the second partition layer includes a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; along a direction away from the function hole, a width of the second metal sub-layer is smaller than each of widths of the first metal sub-layer and the third metal sub-layer, an orthographic projection of the second metal sub-layer on the base substrate is within each of a range of an orthographic projection of the first metal sub-layer and a range of an orthographic projection of the third metal sub-layer on the base substrate, the first metal sub-layer and the third metal sub-layer have protrusions with respect to a sidewall of the second metal sub-layer, and the protrusions and the sidewall of the second metal sub-layer form an inwardly recessed structure.

In an exemplary implementation mode, the first partition layer includes a first conductive sub-layer, a second conductive sub-layer disposed on a side of the first conductive sub-layer away from the base substrate, and a third conductive sub-layer disposed on a side of the second conductive sub-layer away from the base substrate; a cross-sectional shape of the second conductive sub-layer is a first trapezoid, wherein the first trapezoid includes a first lower bottom on a side close to the base substrate and a first upper bottom on a side away from the base substrate; along the direction away from the function hole, a width of the first upper bottom is less than a width of the first lower bottom, an orthographic projection of the first upper bottom on the base substrate is within a range of an orthographic projection of the first lower bottom on the base substrate; a width of the third conductive sub-layer is less than or equal to the width of the first upper bottom, and an orthographic projection of the third conductive sub-layer on the base substrate is within a range of the orthographic projection of the first upper bottom on the base substrate; the width of the first lower bottom is less than or equal to a width of the first conductive sub-layer, and the orthographic projection of the first lower bottom on the base substrate is within a range of an orthographic projection of the first conductive sub-layer on the base substrate.

In an exemplary implementation mode, a width of the first metal sub-layer is less than or equal to the width of the third conductive sub-layer, and an orthographic projection of the first metal sub-layer on the base substrate is within a range of the orthographic projection of the third conductive sub-layer on the base substrate.

In an exemplary implementation mode, the display region includes a first insulation layer, a semiconductor layer, a second insulation layer, a first conductive layer, a third insulation layer, a second conductive layer, a fourth insulation layer, a third conductive layer, a first planarization layer, a fourth conductive layer, and a second planarization layer disposed in sequence on the base substrate, the first partition layer is disposed in a same layer as the third conductive layer, and the second partition layer is disposed in a same layer as the fourth conductive layer.

In another aspect, the present disclosure further provides a display apparatus, including the aforementioned display substrate.

In yet another aspect, the present disclosure further provides a preparation method of a display substrate, wherein the display substrate includes a display region and at least one hole region located in the display region, the hole region includes a function hole and a partition region surrounding the function hole; the preparation method includes: forming at least one partition dam surrounding the function hole in the partition region; wherein the partition dam includes a first partition layer and a second partition layer which are stacked, at least one partition layer includes a second sub-layer and a third sub-layer disposed on a side of the second sub-layer away from a base substrate, the third sub-layer has a protrusion with respect to a sidewall of the second sub-layer, the protrusion and the sidewall of the second sub-layer form an inwardly recessed structure.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of various components in the drawings do not reflect actual scales, and are only intended to schematically illustrate contents of the present disclosure.

Figure 1:
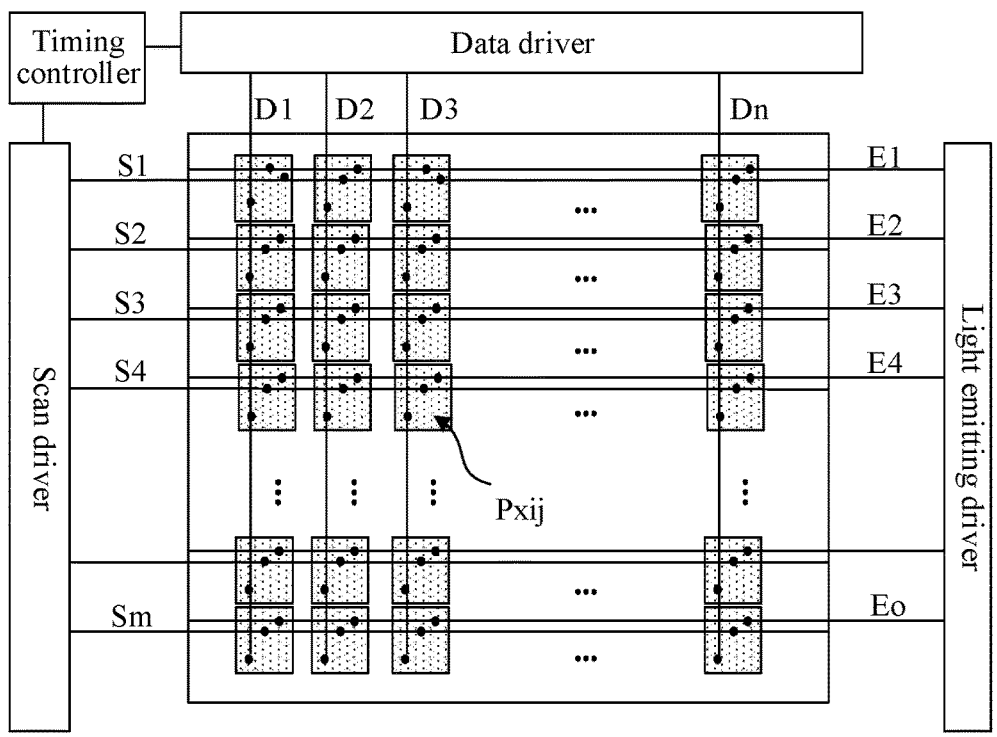
FIG. 1 is a schematic diagram of a structure of a display substrate.

| Reference signs are described as follows. | | |
|---|---|---|
| 10-base substrate; | 11-first insulation layer; | 12-second insulation layer; |
| 13-third insulation layer; | 14-fourth insulation layer; | 15-first planarization layer; |
| 16-second planarization layer; | 17-anode connection electrode; | 21-anode; |
| 22-pixel definition layer; | 23-organic emitting layer; | 24-organic emitting block; |
| 25-cathode; | 26-cathode block; | 31-first encapsulation layer; |
| 32-second encapsulation layer; | 33-third encapsulation layer; | 40-first partition layer; |
| 41-first conductive sub-layer; | 42-second conductive sub-layer; | 43-third conductive sub-layer; |
| 50-second partition layer; | 51-first metal sub-layer; | 52-second metal sub-layer; |
| 53-third metal sub-layer; | 100-display region; | 101-drive structure layer; |
| 102-emitting structure layer; | 103-encapsulation structure layer | 200-hole region; |
| 201-hole region structure layer; | 210-function hole; | 220-partition region; |
| 300-partition dam. | | |

DETAILED DESCRIPTION

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and other structures may refer to usual designs.

Scales of the drawings in the present disclosure may be used as a reference in an actual process, but are not limited thereto. For example, a width-length ratio of a channel, a thickness and a pitch of each film layer, and a width and a pitch of each signal line may be adjusted according to actual needs. A quantity of pixels in a display substrate and a quantity of sub-pixels in each pixel are not limited to quantities shown in the drawings. The drawings described in the present disclosure are schematic structure diagrams only, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two elements. Those of ordinary skill in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a direction of a current is changed during operation of a circuit, or the like, functions of the "source electrode" and the "drain electrode" are sometimes interchangeable. Therefore, the "source electrode" and the "drain electrode" are interchanged in the specification.

In the specification, an "electrical connection" includes a case that constituent elements are connected together through an element with some electrical effect. The "element with some electrical effect" is not particularly limited as long as electrical signals may be sent and received between the connected constituent elements. Examples of the "element with some electrical effect" not only include electrodes and wirings, but also include switching elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in this specification are not strictly defined, and may be an approximate triangle, rectangle, trapezoid, pentagon, or hexagon, etc. There may be some small deformations caused by tolerance, and there may be a guide angle, an arc edge, and a deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with multiple data signal lines (D1 to Dn) respectively, the scan driver is connected with multiple scan signal lines (S1 to Sm) respectively, and the light emitting driver is connected with multiple light emitting signal lines (E1 to Eo) respectively. The pixel array may include multiple sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line, and a pixel drive circuit. In an exemplary implementation mode, the timing controller may provide a gray value and a control signal, which are suitable for a specification of the data driver, to the data driver, provide a clock signal, a scan start signal, etc., which are suitable for a specification of the scan driver, to the scan driver, and provide a clock signal, an emission stop signal, etc., which are suitable for a specification of the light emitting driver, to the light emitting driver. The data driver may generate data voltages to be provided to data signal lines D1, D2, D3, . . . , and Dn using the gray scale value and the control signal received from the timing controller. For example, the data driver may sample the gray value using the clock signal and apply a data voltage corresponding to the gray value to the data signal lines D1 to Dn by taking a pixel row as a unit, wherein n may be a natural number. The scan driver may generate scan signals to be provided to scan signal lines S1, S2, S3, . . . , and Sm by receiving a clock signal, a scan start signal, and the like from the timing controller. For example, the scan driver may provide sequentially a scan signal with a turn-on level pulse to the scan signal lines S1 to Sm. For example, the scan driver may be constructed in a form of a shift register and may generate a scan signal in a manner of transmitting sequentially a scan start signal provided in a form of a turn-on level pulse to a next-stage circuit under control of the clock signal, wherein m may be a natural number. The emitting driver may generate emission signals to be provided to emitting lines E1, E2, E3, . . . , and Eo by receiving the clock signal, the emission stop signal, and the like from the timing controller. For example, the light emitting driver may provide an emission signal with a turn-off level pulse to the light emitting signal lines E1 to Eo sequentially. For example, the light emitting driver may be constructed in a form of a shift register and may generate an emission signal in a manner of transmitting sequentially an emission stop signal provided in a form of a turn-off level pulse to a next-stage circuit under control of the clock signal, wherein o may be a natural number.

For a product such as an intelligent terminal, a front camera, a fingerprint sensor, or a light sensor usually needs to be set. In order to increase screen-to-body ratio, a technology of opening a hole in a display region is usually adopted for a product with a full screen, a narrow frame, or the like, and a device such as a front camera, a fingerprint sensor, or a light sensor is set in a function hole. Since a sidewall of the function hole will expose an organic emitting layer and a cathode, water and oxygen in atmosphere will invade a display substrate along the organic emitting layer, causing the organic emitting layer to fail, resulting in poor display. Therefore, one of difficulties of a solution of opening a hole on the display substrate lies in effectiveness of encapsulation.

Figure 2:
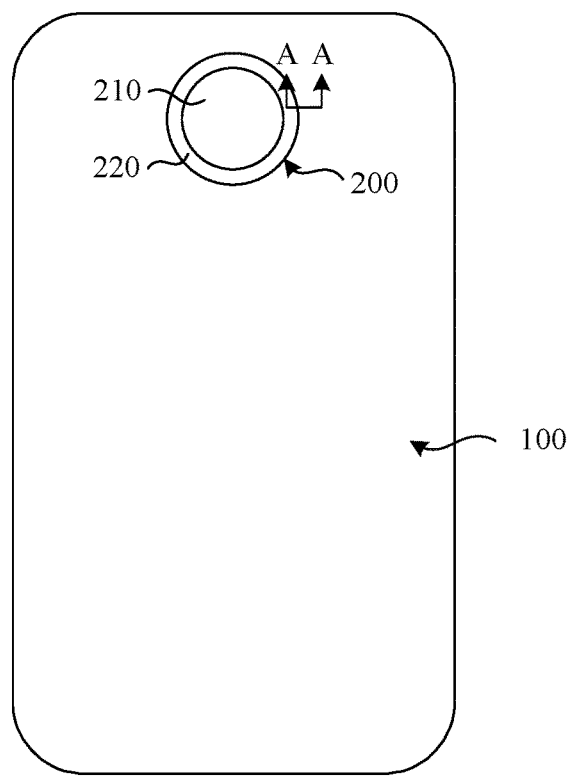
FIG. 2 is a schematic diagram of a planar structure of a display substrate.

FIG. 2 is a schematic diagram of a planar structure of a display substrate. As shown in FIG. 2, on a plane parallel to the display substrate, the display substrate may include a display region 100 and at least one hole region 200 located in the display region 100, the display region 100 is configured to perform image display and the hole region 200 is configured to mount an optical apparatus. In an exemplary implementation mode, the hole region 200 may include at least one function hole 210 and a partition region 220 surrounding the function hole 210, that is, the partition region 220 is disposed between the function hole 210 and the display region 100, and the partition region 220 is configured to provide at least one partition structure configured to insulate water and oxygen in the function hole from invading the display substrate to ensure effectiveness of the display substrate.

In an exemplary implementation mode, a position of the hole region 200 in the display region 100 is not limited, and the hole region 200 may be located within the display region 100, such as in an upper or lower part of the display region 100, or the hole region 200 may be located at an edge of the display region 100, which is not limited in the present disclosure.

In an exemplary implementation mode, in a plane parallel to the display substrate, a shape of the hole region 200 may be any one or more of following: a rectangle, a polygon, a circle, and an ellipse, and the optical apparatus may be an optical sensor such as a camera apparatus, a fingerprint recognition apparatus, or a 3D imaging apparatus, and the present disclosure is not limited herein.

In the exemplary implementation mode, a base substrate and a structure film layer in the function hole 210 are completely removed to form a through-hole structure, or a part of the base substrate and a part of the structure film layer in the function hole 210 are removed to form a blind-hole structure, which is not limited in the present disclosure.

Figure 3:
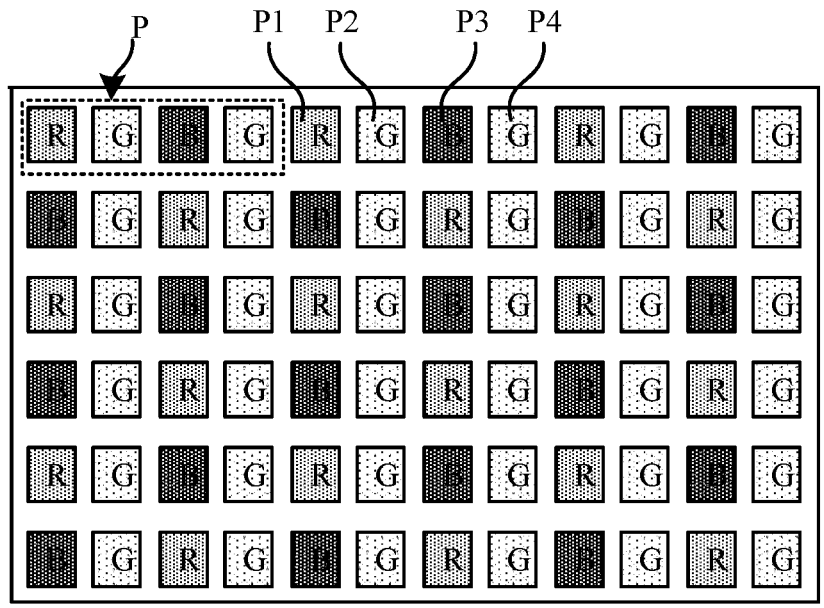
FIG. 3 is a schematic diagram of a planar structure of a display region.

FIG. 3 is a schematic diagram of a planar structure of a display region. As shown in FIG. 3, the display region may include multiple pixel units P disposed in a matrix manner. At least one pixel unit P may include a first sub-pixel P1 that emits light of a first color, a second sub-pixel P2 that emits light of a second color, a third sub-pixel P3 that emits light of a third color, and a fourth sub-pixel P4 that emits light of a fourth color. Each of the four sub-pixels may include a pixel drive circuit and a light emitting device. The pixel drive circuit in the four sub-pixels is connected with a scan signal line, a data signal line, and a light emitting signal line respectively. The pixel drive circuit is configured to receive a data voltage transmitted by the data signal line and output a corresponding current to the light emitting device under control of the scan signal line and the light emitting signal line. The light emitting device in the four sub-pixels is respectively connected with a pixel drive circuit of a sub-pixel where the light emitting device is located, and is configured to emit light with corresponding brightness in response to a current output by the pixel drive circuit of the sub-pixel where the light emitting device is located.

In an exemplary implementation mode, the first sub-pixel P1 may be a red sub-pixel emitting red (R) light, the second sub-pixel P2 may be a green sub-pixel emitting green (G) light, the third sub-pixel P3 may be a blue sub-pixel emitting blue (B) light, and the fourth sub-pixel P4 may be a green sub-pixel emitting green (G) light. In an exemplary implementation mode, a shape of a sub-pixel in a pixel unit may be a rectangle, a rhombus, a pentagon, or a hexagon, etc., and may be arranged in a manner to stand side by side horizontally, in a manner to stand side by side vertically, in a manner to form a square, or in a manner to form a diamond, etc., and the present disclosure is not limited herein.

In an exemplary implementation mode, the four sub-pixels may include a red sub-pixel, a green sub-pixel, a blue sub-pixel, and a white sub-pixel that emits white (W) light. In an exemplary implementation mode, a pixel unit may include three sub-pixels, such as a red sub-pixel, a blue sub-pixel, and a green sub-pixel. The three sub-pixels may be arranged in a manner to stand side by side horizontally, in a manner to stand side by side vertically, or a manner like a Chinese character "品", and the present disclosure is not limited herein.

Figure 4:
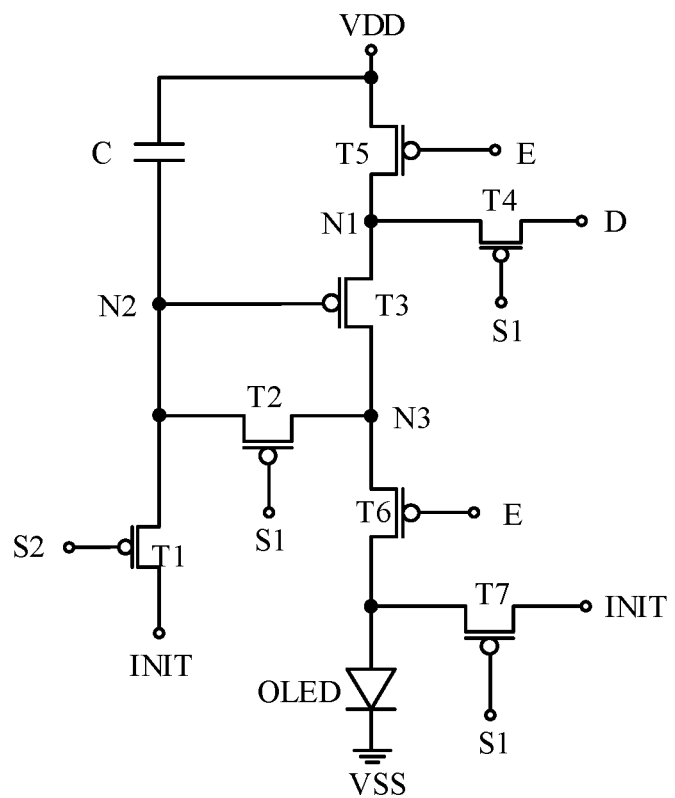
FIG. 4 is a schematic diagram of an equivalent circuit of a pixel drive circuit.

FIG. 4 is a schematic diagram of an equivalent circuit of a pixel drive circuit. In an exemplary implementation mode, the pixel drive circuit may be of a structure of 3T1C, 4T1C, 5T1C, 5T2C, 6T1C, or 7T1C. As shown in FIG. 4, the pixel drive circuit may include seven transistors (a first transistor T1 to a seventh transistor T7), and one storage capacitor C. The pixel drive circuit is connected with seven signal lines (a data signal line D, a first scan signal line S1, a second scan signal line S2, a light emitting signal line E, an initial signal line INIT, a first first partition structure VDD, and a second first partition structure VSS).

In an exemplary implementation mode, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a control electrode of the third transistor T3, and a second terminal of the storage capacitor C, and the third node N3 is respectively connected with a second electrode of the second transistor T2, a second electrode of the third transistor T3, and a first electrode of the sixth transistor T6.

In an exemplary implementation mode, a first terminal of the storage capacitor C is connected with the first first partition structure VDD, and the second terminal of the storage capacitor C is connected with the second node N2, namely the second terminal of the storage capacitor C is connected with the control electrode of the third transistor T3.

A control electrode of the first transistor T1 is connected with the second scan signal line S2, a first electrode of the first transistor T1 is connected with the initial signal line INIT, and the second electrode of the first transistor is connected with the second node N2. When a scan signal with a turn-on level is applied to the second scan signal line S2, the first transistor T1 transmits an initialization voltage to the control electrode of the third transistor T3 so as to initialize a charge amount of the control electrode of the third transistor T3.

A control electrode of the second transistor T2 is connected with the first scan signal line S1, the first electrode of the second transistor T2 is connected with the second node N2, and the second electrode of the second transistor T2 is connected with the third node N3. When a scan signal with a turn-on level is applied to the first scan signal line S1, the second transistor T2 enables the control electrode of the third transistor T3 to be connected with the second electrode of the third transistor T3.

The control electrode of the third transistor T3 is connected with the second node N2, namely the control electrode of the third transistor T3 is connected with the second terminal of the storage capacitor C, the first electrode of the third transistor T3 is connected with the first node N1, and the second electrode of the third transistor T3 is connected with the third node N3. The third transistor T3 may be referred to as a drive transistor. The third transistor T3 determines an amount of a drive current flowing between the first first partition structure VDD and the second first partition structure VSS according to a potential difference between its control electrode and the first electrode.

A control electrode of the fourth transistor T4 is connected with the first scan signal line S1, a first electrode of the fourth transistor T4 is connected with the data signal line D, and the second electrode of the fourth transistor T4 is connected with the first node N1. The fourth transistor T4 may be referred to as a switching transistor, a scan transistor, etc., and when a scan signal with a turn-on level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first first partition structure VDD, and the second electrode of the fifth transistor T5 is connected with the first node N1. A control electrode of the sixth transistor T6 is connected with the light emitting signal line E, the first electrode of the sixth transistor T6 is connected with the third node N3, and a second electrode of the sixth transistor T6 is connected with a first electrode of a light emitting device. The fifth transistor T5 and the sixth transistor T6 may be referred to as light emitting transistors. When a light emitting signal with a turn-on level is applied to the light emitting signal line E, the fifth transistor T5 and the sixth transistor T6 make the light emitting device emit light by forming a drive current path between the first first partition structure VDD and the second first partition structure VSS.

A control electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with a turn-on level is applied to the first scan signal line S1, the seventh transistor T7 transmits an initialization voltage to the first electrode of the light emitting device so as to initialize a charge amount accumulated in the first electrode of the light emitting device or release a charge amount accumulated in the first electrode of the light emitting device.

In an exemplary implementation mode, a second electrode of the light emitting device is connected with the second first partition structure VSS, a signal of the second first partition structure VSS is a low-level signal, and a signal of the first first partition structure VDD is a high-level signal continuously provided. The first scan signal line S1 is a scan signal line in a pixel drive circuit of a current display row, and the second scan signal line S2 is a scan signal line in a pixel drive circuit of a previous display row. That is, for an n-th display row, the first scan signal line S1 is S(n), and the second scan signal line S2 is S(n−1). The second scan signal line S2 of the current display row and the first scan signal line S1 in the pixel drive circuit of the previous display row are a same signal line, thus signal lines of a display panel may be reduced, so that a narrow bezel of the display panel is achieved.

In an exemplary implementation mode, the first transistor T1 to the seventh transistor T7 may be P-type transistors or N-type transistors. Use of a same type of transistors in a pixel drive circuit may simplify a process flow, reduce process difficulties of a display panel, and improve a product yield. In some possible implementation modes, the first transistor T1 to the seventh transistor T7 may include a P-type transistor and an N-type transistor.

In an exemplary implementation mode, the first scan signal line S1, the second scan signal line S2, the light emitting signal line E, and the initial signal line INIT extend along a horizontal direction, the second first partition structure VSS, the first first partition structure VDD, and the data signal line D extend along a vertical direction.

In an exemplary implementation mode, the light emitting device may be an Organic light emitting Diode (OLED), including a first electrode (anode), an organic emitting layer, and a second electrode (cathode) that are stacked.

Figure 5:
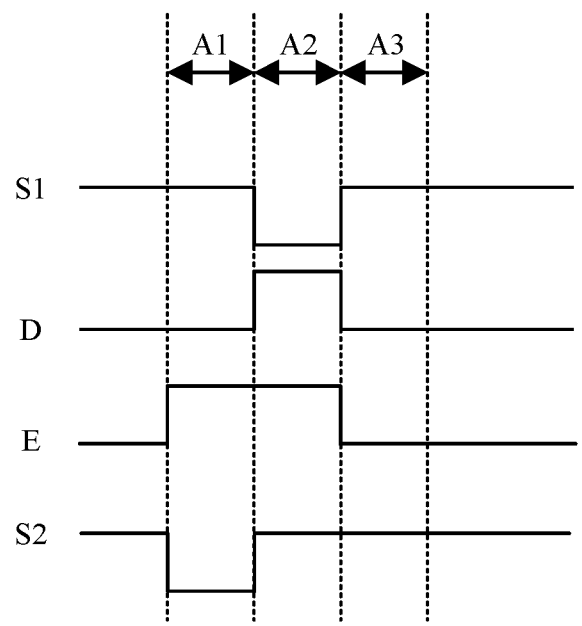
FIG. 5 is a working timing diagram of a pixel drive circuit.

FIG. 5 is a working timing diagram of a pixel drive circuit. The exemplary embodiment of the present disclosure will be described below through a working process of the pixel drive circuit illustrated in FIG. 4. The pixel drive circuit in FIG. 4 includes seven transistors (a first transistor T1 to a seventh transistor T7) and one storage capacitor C.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the light emitting signal line E are the high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second terminal of the storage capacitor C is at a low level, so the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage outputted by the data signal line D is provided to the second node N2 through a first node N1, the turned-on third transistor T3, the third node N3, and the turned-on second transistor T2, and the storage capacitor C is charged with a difference between the data voltage outputted by the data signal line D and a threshold voltage of the third transistor T3. A voltage of the second terminal (the second node N2) of the storage capacitor C is Vd−|Vth|, wherein Vd is the data voltage outputted by the data signal line D, and Vth is the threshold voltage of the third transistor T3. The seventh transistor T7 is turned on, so that an initialization voltage of the initial signal line INIT is provided to a first electrode of the OLED to initialize (reset) the first electrode of the OLED and clear a pre-stored voltage therein, thereby completing initialization to ensure that the OLED does not emit light. A signal of the second scan signal line S2 is a high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage outputted by the first first partition structure VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vd−|Vth|, so that the drive current of the third transistor T3 is as follows.

$$I = K^*(Vgs - Vth)^2 = K^*[Vdd - Vd + |Vth|) - Vth]^2 = K^*[(Vdd - Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage outputted by the data signal line D, and Vdd is the power voltage outputted by the first first partition structure VDD.

Figure 6:
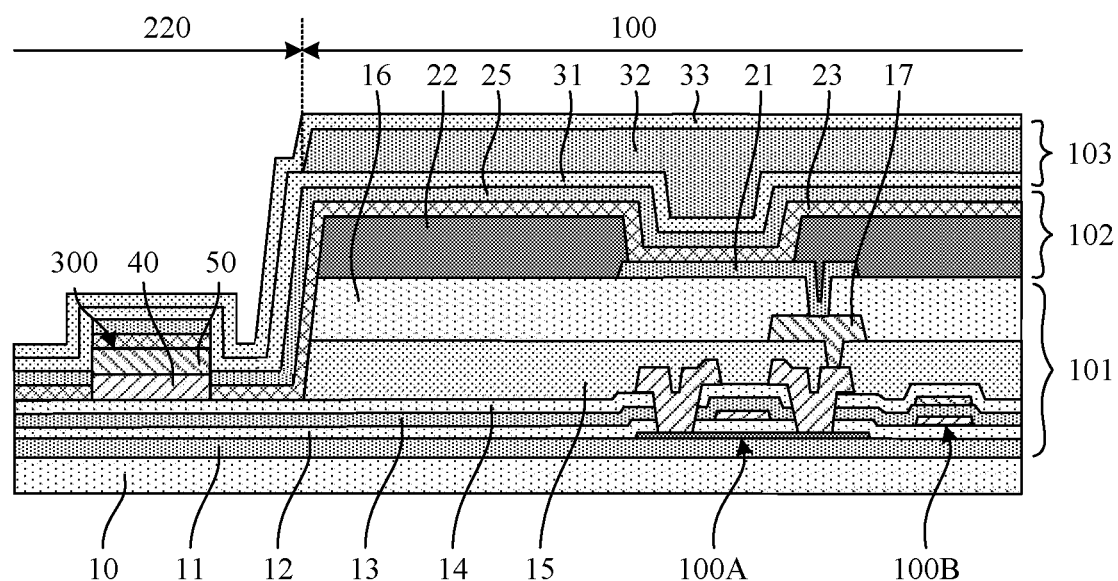
FIG. 6 is a schematic diagram of a cross-sectional structure of a display substrate according to an exemplary embodiment of the present disclosure.

FIG. 6 is a schematic diagram of a cross-sectional structure of a display substrate according to an exemplary embodiment of the present disclosure. In an exemplary implementation mode, the display substrate may include a display region 100 and at least one hole region 200 located in the display region 100, and the hole region 200 may include a function hole 210 and a partition region 220 surrounding the function hole 210. FIG. 6 illustrates a cross-sectional structure of the display region 100 and the partition region 220, and is a cross-sectional view taken along an A-A direction in FIG. 2. In an exemplary implementation mode, the partition region 220 is provided with at least one partition dam 300 surrounding the function hole 210, and the partition dam 300 is configured to insulate water and oxygen in the function hole from intruding the display substrate.

In an exemplary implementation mode, the partition dam 300 may include a first partition layer 40 disposed on a base substrate 10 and a second partition layer 50 disposed on a side of the first partition layer 40 away from the base substrate. At least one partition layer may include a second sub-layer and a third sub-layer disposed on a side of the second sub-layer away from the base substrate, the third sub-layer has a protrusion with respect to a sidewall of the second sub-layer, and the protrusion and the sidewall of the second sub-layer form an inwardly recessed structure.

In an exemplary implementation mode, the at least one partition layer may further include a first sub-layer, and the second sub-layer may be disposed on a side of the first sub-layer away from the base substrate.

In an exemplary implementation mode, the first partition layer 40 may include a first conductive sub-layer, a second conductive sub-layer, and a third conductive sub-layer that are stacked, and the second partition layer 50 may include a first metal sub-layer, a second metal sub-layer, and a third metal sub-layer that are stacked.

In an exemplary implementation mode, the three conductive sub-layers of the first partition layer 40 may form a "⊥"-shaped structure, the three metal sub-layers of the second partition layer 50 may form a "⊥"-shaped structure, and the first partition layer 40 and the second partition layer 50 together form a partition dam structure in which double "⊥"-shaped structures are stacked.

In another exemplary implementation mode, the three conductive sub-layers of the first partition layer 40 may form a "⊥"-shaped structure, the three metal sub-layers of the second partition layer 50 may form a trapezoidal structure, and the first partition layer 40 and the second partition layer 50 together form a partition dam structure in which an upper trapezoidal structure and a lower "⊥"-shaped structure are stacked.

In yet another exemplary implementation mode, the three conductive sub-layers of the first partition layer 40 may form a trapezoidal structure, the three metal sub-layers of the second partition layer 50 may form a "⊥"-shaped structure, and the first partition layer 40 and the second partition layer 50 together form a partition dam structure in which an upper "⊥"-shaped structure and a lower trapezoidal structure are stacked.

In an exemplary implementation mode, in a plane perpendicular to the display substrate, the display region may include a drive structure layer 101 provided on the base substrate 10, an emitting structure layer 102 provided on a side of the drive structure layer 101 away from the base substrate, and an encapsulation structure layer 103 provided on a side of the emitting structure layer 102 away from the base substrate. In an exemplary implementation mode, the drive structure layer 101 may include a first insulation layer 11, a semiconductor layer, a second insulation layer 12, a first conductive layer, a third insulation layer 13, a second conductive layer, a fourth insulation layer 14, a third conductive layer, a first planarization layer 15, a fourth conductive layer, and a second planarization layer 16 disposed in sequence on the base substrate 10. The semiconductor layer may include a first active layer, the first conductive layer may include a first gate electrode and a first electrode plate, the second conductive layer may include a second electrode plate, and the third conductive layer may include a first source electrode and a first drain electrode. The first active layer, the first gate electrode, the first source electrode, and the first drain electrode may form a transistor 100A, and the first electrode plate and the second electrode plate may form a storage capacitor 100B. The emitting structure layer 102 may include an anode 21, a pixel definition layer 22, an organic emitting layer 23, and a cathode 25. The encapsulation structure layer 103 may include a first encapsulation layer 31, a second encapsulation layer 32, and a third encapsulation layer 33 which are stacked.

In an exemplary implementation mode, the first partition layer 40 and the third conductive layer may be disposed in a same layer and are formed simultaneously through a same patterning process, and the second partition layer 50 and the fourth conductive layer may be disposed in the same layer and are formed simultaneously through a same patterning process.

In an exemplary implementation mode, the partition region 220 may be provided with multiple partition dams 300 surrounding the function hole 210, thereby forming a multi-circle partition structure.

Figure 7:
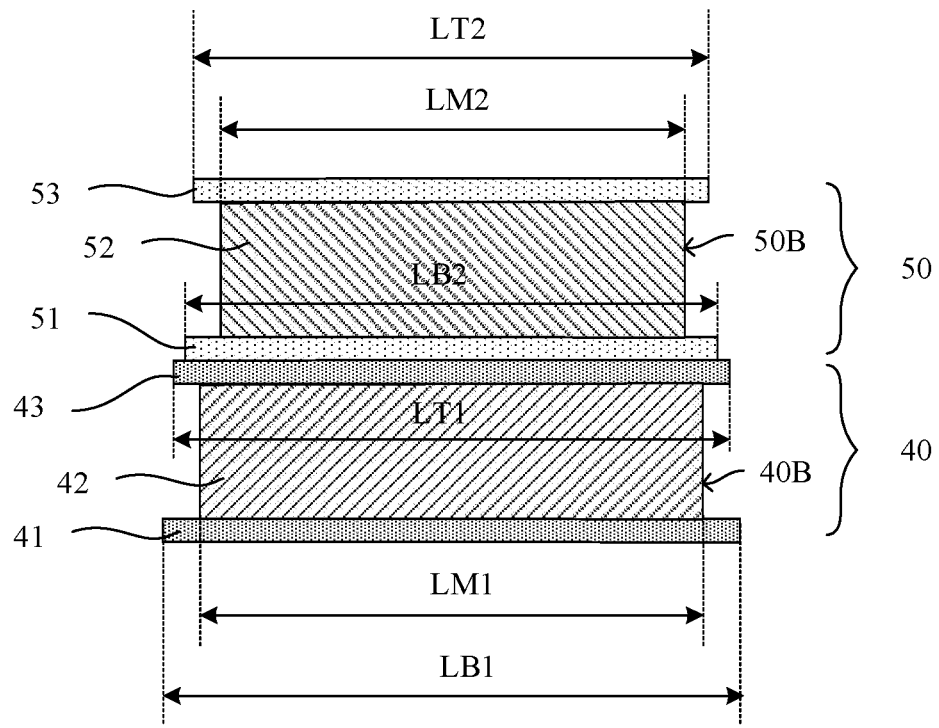
FIG. 7 is a schematic diagram of a structure of a partition dam according to an exemplary embodiment of the present disclosure.

FIG. 7 is a schematic diagram of a structure of a partition dam according to an exemplary embodiment of the present disclosure. As shown in FIG. 7, the partition dam of this exemplary embodiment may include a first partition layer 40 and a second partition layer 50 disposed on a side of the first partition layer 40 away from a base substrate. The first partition layer 40 may include a first conductive sub-layer 41, a second conductive sub-layer 42 disposed on a side of the first conductive sub-layer 41 away from the base substrate, and a third conductive sub-layer 43 disposed on a side of the second conductive sub-layer 42 away from the base substrate. The second partition layer 50 may include a first metal sub-layer 51 disposed on a side of the third conductive sub-layer 43 away from the base substrate, a second metal sub-layer 52 disposed on a side of the first metal sub-layer 51 away from the base substrate, and a third metal sub-layer 53 disposed on a side of the second metal sub-layer 52 away from the base substrate.

In an exemplary implementation mode, the first conductive sub-layer 41 and the third conductive sub-layer 43 have protrusions with respect to a sidewall 40B of the second conductive sub-layer 42, and the upper and lower protrusions and the sidewall 40B of the second sub-layer form an inwardly recessed structure such that the first conductive sub-layer 41, the second conductive sub-layer 42, and the third conductive sub-layer 43 that are stacked form a first "⊥"-shaped structure.

In an exemplary implementation mode, the first metal sub-layer 51 and the third metal sub-layer 53 have protrusions with respect to a sidewall 50B of the second metal sub-layer 52, and the upper and lower protrusions and the sidewall 50B of the second metal layer form an inwardly recessed structure such that the first metal sub-layer 51, the second metal sub-layer 52, and the third metal sub-layer 53 that are stacked form a second "⊥"-shaped structure.

In an exemplary implementation mode, the first "⊥"-shaped structure and the second "⊥"-shaped structure disposed on a side of the first "⊥"-shaped structure away from the base substrate form a partition dam structure in which double "⊥"-shaped structures are stacked.

In an exemplary implementation mode, an overall width of the second "⊥"-shaped structure may be less than an overall width of the first "⊥"-shaped structure, that is, the partition dam structure has an overall shape with a relatively small upper layer and a relatively large lower layer, wherein a width is a dimension away from a direction of the function hole.

In an exemplary implementation mode, a width LT1 of the third conductive sub-layer 43 may be less than or equal to a width LB1 of the first conductive sub-layer 41, and an orthographic projection of the third conductive sub-layer 43 on the base substrate may be within a range of an orthographic projection of the first conductive sub-layer 41 on the base substrate.

In an exemplary implementation mode, a width LM1 of the second conductive sub-layer 42 may be smaller than a width LB1 of the first conductive sub-layer 41, and an orthographic projection of the second conductive sub-layer 42 on the base substrate may be within a range of an orthographic projection of the first conductive sub-layer 41 on the base substrate.

In an exemplary implementation mode, a width LM1 of the second conductive sub-layer 42 may be smaller than a width LT1 of the third conductive sub-layer 43, and an orthographic projection of the second conductive sub-layer 42 on the base substrate may be within a range of an orthographic projection of the third conductive sub-layer 43 on the base substrate.

In an exemplary implementation mode, a width LT2 of the third metal sub-layer 53 may be less than or equal to a width LB2 of the first metal sub-layer 51, and an orthographic projection of the third metal sub-layer 53 on the base substrate may be within a range of an orthographic projection of the first metal sub-layer 51 on the base substrate.

In an exemplary implementation mode, a width LM2 of the second metal sub-layer 52 may be smaller than a width LB2 of the first metal sub-layer 51, and an orthographic projection of the second metal sub-layer 52 on the base substrate may be within a range of an orthographic projection of the first metal sub-layer 51 on the base substrate.

In an exemplary implementation mode, a width LM2 of the second metal sub-layer 52 may be smaller than a width LT2 of the third metal sub-layer 53, and an orthographic projection of the second metal sub-layer 52 on the base substrate may be within a range of an orthographic projection of the third metal sub-layer 53 on the base substrate.

In an exemplary implementation mode, a width LB2 of the first metal sub-layer 51 may be smaller than a width LB1 of the first conductive sub-layer 41, and an orthographic projection of the first metal sub-layer 51 on the base substrate may be within a range of an orthographic projection of the first conductive sub-layer 41 on the base substrate.

In an exemplary implementation mode, a width LM2 of the second metal sub-layer 52 may be smaller than a width LM1 of the second conductive sub-layer 42, and an orthographic projection of the second conductive sub-layer 42 on the base substrate may be within a range of an orthographic projection of the second metal sub-layer 52 on the base substrate.

In an exemplary implementation mode, a width LT2 of the third metal sub-layer 53 may be smaller than a width LT1 of the third conductive sub-layer 43, and an orthographic projection of the third metal sub-layer 53 on the base substrate may be within a range of an orthographic projection of the third conductive sub-layer 43 on the base substrate.

In an exemplary implementation mode, a width LB2 of the first metal sub-layer 51 may be less than or equal to a width LT1 of the third conductive sub-layer 43, and an orthographic projection of the first metal sub-layer 51 on the base substrate may be within a range of an orthographic projection of the third conductive sub-layer 43 on the base substrate.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed in a same layer" mentioned in the present disclosure means that A and B are formed simultaneously through a same patterning process, and a "thickness" of a film layer is a dimension of the film layer in a direction perpendicular to a display substrate. In an exemplary implementation mode of the present disclosure, "an orthographic projection of B is within a range of an orthographic projection of A" means that a boundary of the orthographic projection of B falls within a range of a boundary of the orthographic projection of A, or the boundary of the orthographic projection of A is overlapped with the boundary of the orthographic projection of B.

In an exemplary implementation mode, the display substrate may include a display region 100 and a hole region 200, the hole region 200 may include a function hole 210 and a partition region 220 surrounding the function hole 210, and the partition region 220 is provided with at least one circle of partition dams. In an exemplary implementation mode, taking a circle of partition dams in the partition region 220 and a sub-pixel in the display region 100 as examples, the preparation process of the display substrate of the exemplary embodiment of the present disclosure may include following operations.

Figure 8:
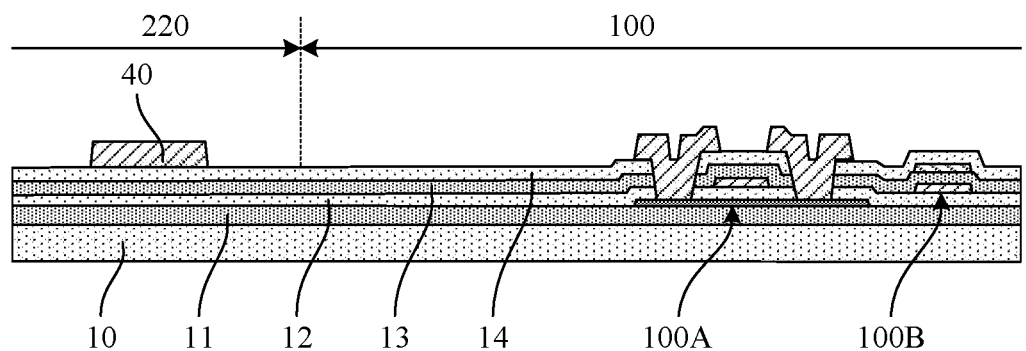
FIG. 8 is a schematic diagram after a pattern of a transistor structure layer is formed according to an embodiment of the present disclosure.

(11) Forming a pattern of a transistor structure layer on a base substrate, as shown in FIG. 8. In an exemplary implementation mode, the forming the pattern of the transistor structure layer on the base substrate may include: a first insulation thin film and a semiconductor thin film are sequentially deposited on the base substrate, and the semiconductor thin film is patterned through a patterning process to form a first insulation layer 11 disposed on the base substrate and a pattern of a semiconductor layer disposed on the first insulation layer 11. The pattern of the semiconductor layer at least includes a first active layer located in a display region 100.

Subsequently, a second insulation thin film and a first conductive thin film are sequentially deposited, and the first conductive thin film is patterned through a patterning process to form a second insulation layer 12 covering the pattern of the semiconductor layer and a pattern of a first conductive layer disposed on the second insulation layer 12. The pattern of the first conductive layer at least includes: a first gate electrode and a first electrode plate located in the display region 100.

Subsequently, a third insulation thin film and a second conductive thin film are sequentially deposited, and the second conductive thin film is patterned through a patterning process to form a third insulation layer 13 covering the first conductive layer, and a pattern of a second conductive layer disposed on the third insulation layer 13. The pattern of the second conductive layer at least includes: a second electrode plate located in the display region 100, an orthographic projection of the second electrode plate on the base substrate and an orthographic projection of the first electrode plate on the base substrate are at least partially overlapped.

Subsequently, a fourth insulation thin film is deposited, and the fourth insulation thin film is patterned through a patterning process to form a pattern of a fourth insulation layer 14 covering the pattern of the second conductive layer, and multiple active vias are formed on the fourth insulation layer 14. The multiple vias at least include: at least two active vias located in the display region 100, and the two active vias respectively expose two ends of the first active layer.

Subsequently, a third conductive thin film is deposited, and the third conductive thin film is patterned through a patterning process to form a pattern of a third conductive layer on the fourth insulation layer 14. The pattern of the third conductive layer at least includes a first source electrode and a first drain electrode located in the display region 100, and a first partition layer 40 located in a partition region 220, wherein the first source electrode and the first drain electrode are respectively connected with the two ends of the first active layer through an active via. In an exemplary implementation mode, the third conductive layer may be referred to as a first source drain metal layer (SD1).

So far, preparation of the pattern of the transistor structure layer is completed, as shown in FIG. 8. In an exemplary implementation mode, a transistor structure layer of each sub-pixel in the display region 100 may include multiple transistors and a storage capacitor constituting a pixel drive circuit. In FIG. 8, only one transistor 100A and one storage capacitor 100B are used as an example. In an exemplary implementation mode, the transistor 100A may include a first active layer, a first gate electrode, a first source electrode, and a first drain electrode, and the storage capacitor 100B may include a first electrode plate and a second electrode plate. In an exemplary implementation mode, a transistor may be a drive transistor in a pixel drive circuit. The drive transistor may be a Thin Film Transistor (TFT).

In an exemplary implementation mode, a transistor structure layer of the partition region 220 may include a composite insulation layer disposed on a base substrate 10 and a first partition layer 40 disposed on a side of the composite insulation layer away from the base substrate. The composite insulation layer may include a first insulation layer 11, a second insulation layer 12, a third insulation layer 13, and a fourth insulation layer 14 that are stacked on the base substrate 10.

In an exemplary implementation mode, the base substrate may be a rigid base substrate, or may be a flexible base substrate. In an exemplary implementation mode, the rigid base substrate may be made of a material such as glass or quartz, and the flexible base substrate may be made of a material such as Polyimide (PI). The flexible base substrate may be of a single-layer structure, or may be of a laminated structure composed of an inorganic material layer and a flexible material layer, which is not limited in the present disclosure.

In an exemplary implementation mode, the first insulation layer, the second insulation layer, the third insulation layer, and the fourth insulation layer may be made of any one or more of Silicon Oxide (SiOx), Silicon Nitride (SiNx), and Silicon Nitride (SiON), and may be a single layer, a multi-layer, or a composite layer. The first insulation layer may be referred to as a Buffer layer, the second insulation layer and the third insulation layer may be referred to as Gate insulator (GI) layers, and the fourth insulation layer may be referred to as an Interlayer Dielectric (ILD) layer. A first conductive layer, A second conductive layer, and A third second conductive layer may be made of a metal material, such as any one or more of Argentum (Ag), Copper (Cu), Aluminum (Al), Titanium (Ti), and Molybdenum (Mo), or an alloy material of the abovementioned metals, such as an Aluminum Neodymium alloy (AlNd) or a Molybdenum Niobium alloy (MoNb), and may be of a single-layer structure, or a multi-layer composite structure. A semiconductor layer may be made of various materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene. That is, the present disclosure is applicable to a transistor manufactured based on an oxide technology, a silicon technology, and an organic matter technology.

In an exemplary implementation mode, the third conductive layer may include a first conductive sub-layer, a second conductive sub-layer, and a third conductive sub-layer that are stacked. The first conductive sub-layer and the third conductive sub-layer may be made of metallic Titanium (Ti), and the second conductive sub-layer may be made of metallic Aluminum (Al), thereby forming a composite structure of Ti/Al/Ti.

In an exemplary implementation mode, in a process of patterning the fourth insulation thin film through a patterning process, a first transition hole (not shown) may be formed at a position where a function hole is located in a hole region. The first transition hole may be a through hole and the fourth insulation layer, the third insulation layer, the second insulation layer, the first insulation layer and the base substrate in the first transition hole are removed, or, the first transition hole may be a blind hole and the fourth insulation layer, the third insulation layer, the second insulation layer, and the first insulation layer in the first transition hole are removed, and the present disclosure is not limited herein.

Figure 9:
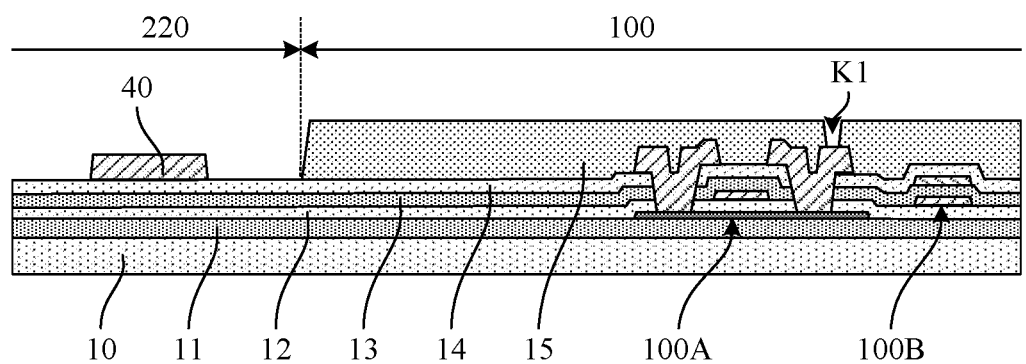
FIG. 9 is a schematic diagram after a pattern of a first planarization layer is formed according to an embodiment of the present disclosure.

(12) Forming a pattern of a first planarization layer. In an exemplary implementation mode, forming the pattern of the first planarization layer may include: coating a first planarization thin film on the base substrate on which the above-mentioned patterns are formed, patterning the first planarization thin film through a patterning process to form a pattern of a first planarization layer 15, as shown in FIG. 9.

In an exemplary implementation mode, the first planarization layer 15 is formed only in the display region 100, and the first planarization thin film of the partition region 220 is removed. A first connection via K1 is provided on the first planarization layer 15 of the display region 100. The first planarization thin film in the first connection via K1 is removed to expose a surface of a first drain electrode of the transistor 100A, and the first connection via K1 is configured to connect an anode connection electrode formed subsequently with the first drain electrode through the via.

In an exemplary implementation mode, patterning the first planarization thin film may include first performing an exposure processing on the first planarization thin film and then performing a development processing on the first planarization thin film after the exposure processing to form a patterned first planarization layer 15.

In an exemplary implementation mode, a developing solution for the development process may be a strong alkaline solution. Since a side surface of the first partition layer 40 is exposed after the first planarization thin film of the partition region 220 is removed, the side surface of the first partition layer 40 will be eroded by the developing solution under an action of the strong alkali solution. For the first partition layer 40 using a multi-layer composite structure of Ti/Al/Ti, since a rate of eroding an aluminum layer (the second conductive sub-layer) by the developing solution is greater than a rate of eroding a titanium layer (the first conductive sub-layer and the third conductive sub-layer) by the developing solution, a side surface pit will be formed on a side surface of the eroded first partition layer 40, and the above of the aluminum layer and the titanium layer above the aluminum layer protrude from the aluminum layer by a distance, forming a " $\bot$ "-shaped structure.

Figure 10:
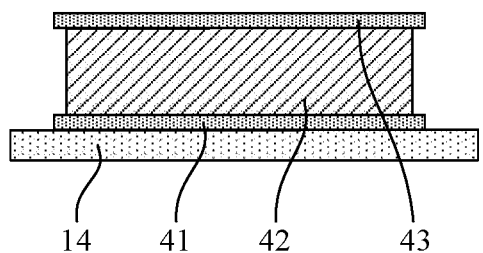
FIG. 10 is a schematic diagram of a structure of a first partition layer in FIG. 9.

FIG. 10 is a schematic diagram of a structure of a first partition layer in FIG. 9. As shown in FIG. 10, the first partition layer 40 may include a first conductive sub-layer 41, a second conductive sub-layer 42, and a third conductive sub-layer 43 that are stacked on the fourth insulation layer 14. That is, the first conductive sub-layer 41 is disposed on a side of the fourth insulation layer 14 away from the base substrate, the second conductive sub-layer 42 is disposed on a side of the first conductive sub-layer 41 away from the base substrate, and the third conductive sub-layer 43 is disposed on a side of the second conductive sub-layer 42 away from the base substrate.

In an exemplary implementation mode, a material of the first conductive sub-layer 41 and the third conductive sub-layer 43 may be metallic titanium and a material of the second conductive sub-layer 423 may be metallic aluminum. Since a rate of eroding the second conductive sub-layer 42 (aluminum) by the developing solution is greater than a rate of eroding the first conductive sub-layer 41 and the third conductive sub-layer 43 (titanium) by the developing solution, after being eroded by the developing solution, an etching amount of a side surface of the second conductive sub-layer 42 is larger than that of side surfaces of the first conductive sub-layer 41 and the third conductive sub-layer 43, and a side surface pit is formed on a side surface of the first partition layer 40, the first conductive sub-layer 41 and the third conductive sub-layer 43 will protrude from the second conductive sub-layer 42 by a distance, forming a " $\bot$ "-shaped structure.

In an exemplary implementation mode, in the first partition layer 40 with the " $\bot$ "-shaped structure, a width of the second conductive sub-layer 42 may be smaller than a width of the first conductive sub-layer 41, and an orthographic projection of the second conductive sub-layer 42 on the base substrate may be within a range of an orthographic projection of the first conductive sub-layer 41 on the base substrate. The width of the second conductive sub-layer 42 may be smaller than a width of the third conductive sub-layer 43, and the orthographic projection of the second conductive sub-layer 42 on the base substrate may be within a range of an orthographic projection of the third conductive sub-layer 43 on the base substrate.

Figure 11:
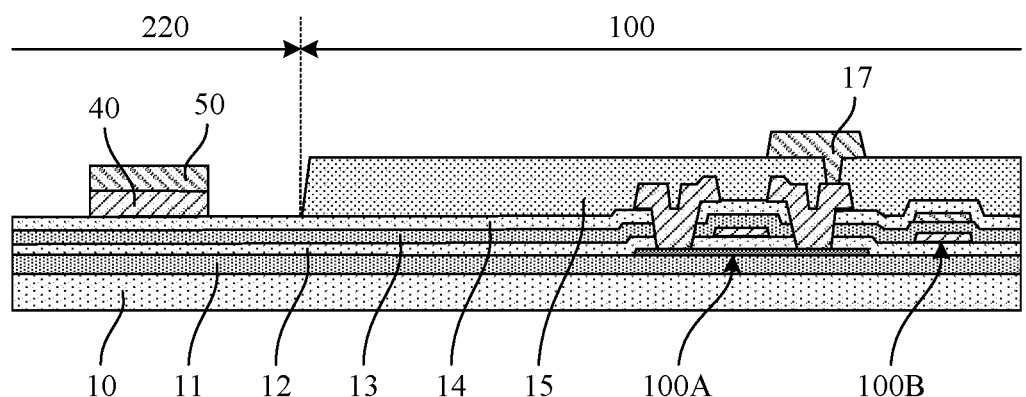
FIG. 11 is a schematic diagram of a pattern of a fourth conductive layer according to an embodiment of the present disclosure.

(13) Forming a pattern of a fourth conductive layer. In an exemplary implementation mode, the forming the pattern of the fourth conductive layer may include: a fourth conductive thin film is deposited on the base substrate on which the aforementioned patterns are formed, the fourth conductive thin film is patterned through a patterning process to form the pattern of the fourth conductive layer, as shown in FIG. 11. In an exemplary implementation mode, the fourth conductive layer may be referred to as a second source drain metal layer (SD2).

In an exemplary implementation mode, the fourth conductive layer may include an anodic connection electrode 17 located in the display region 100 and a second partition layer 50 located in the partition region 220. The anode connection electrode 17 is provided on the first planarization layer 15 of the display region 100 and is connected with a first drain electrode of the transistor 100A through the first connection via K1. The second partition layer 50 is lapped joint on the first partition layer 40 of the partition region 220, so that the second partition layer 50 is directly connected with the first partition layer 40.

Figure 12:
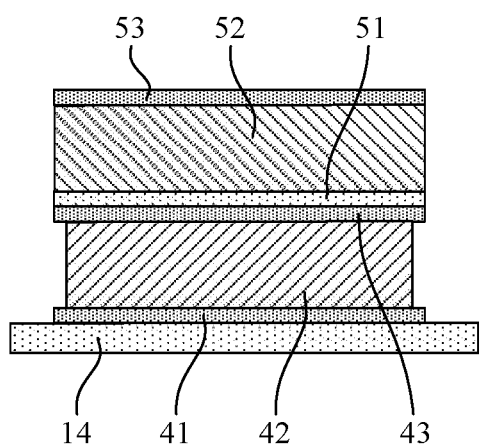
FIG. 12 is a schematic diagram of a structure of a first partition layer and a second partition layer in FIG. 11.

FIG. 12 is a schematic diagram of a structure of a first partition layer and a second partition layer in FIG. 11. As shown in FIG. 12, the second partition layer 50 may include a first metal sub-layer 51, a second metal sub-layer 52, and a third metal sub-layer 53 stacked on the third conductive sub-layer 43. That is, the first metal sub-layer 51 is disposed on a side of the third conductive sub-layer 43 away from the base substrate, the second metal sub-layer 52 is disposed on a side of the first metal sub-layer 51 away from the base substrate, and the third metal sub-layer 53 is disposed on a side of the second metal sub-layer 52 away from the base substrate. In an exemplary implementation mode, a material of the first metal sub-layer 51 and the third metal sub-layer 53 may be metallic titanium and a material of the second metal sub-layer 52 may be metallic aluminum.

In an exemplary implementation mode, side surfaces of the second partition layer 50 are substantially flush, and a side surface of the second partition layer 50 is substantially flush with a side surface of the third conductive sub-layer 43. An orthographic projection of the first metal sub-layer 51 on the base substrate, an orthographic projection of the second metal sub-layer 52 on the base substrate, an orthographic projection of the third metal sub-layer 53 on the base substrate, and an orthographic projection of the third conductive sub-layer 43 on the base substrate may be substantially overlapped. In one possible implementation mode, etching rates of an etching liquid for a titanium layer and an aluminum layer may be different during a patterning process of the fourth conductive thin film, so that after etching, side surfaces of the first metal sub-layer 51 and the third metal sub-layer 53 will protrude from the second metal sub-layer 52 by a distance, which is not limited in the present disclosure.

Figure 13:
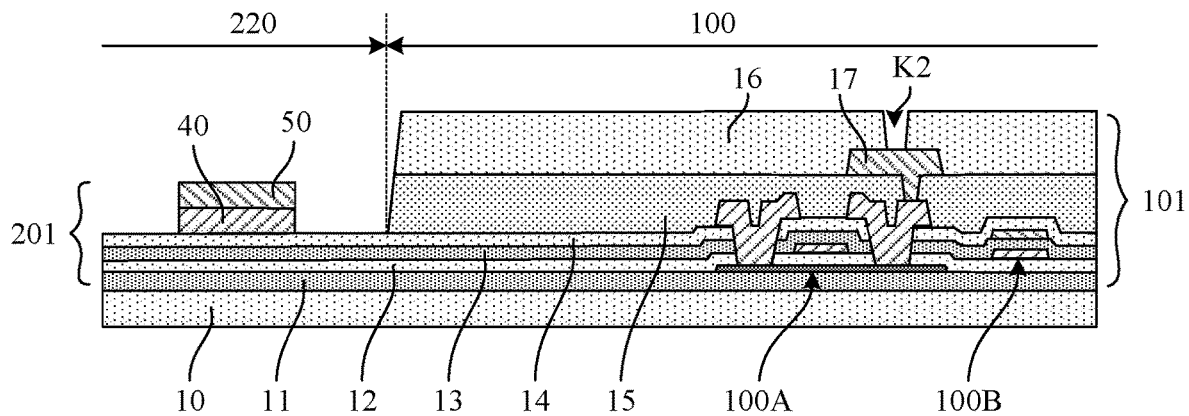
FIG. 13 is a schematic diagram after a pattern of a second planarization layer is formed according to an embodiment of the present disclosure.

(14) Forming a pattern of a second planarization layer. In an exemplary implementation mode, the forming the pattern of the second planarization layer may include: a second planarization thin film is coated on the base substrate on which the above-mentioned patterns are formed, the second planarization thin film is patterned through a patterning process to form a pattern of a second planarization layer 16, as shown in FIG. 13.

In an exemplary implementation mode, the second planarization layer 16 is formed only in the display region 100, and the second planarization thin film of the partition region 220 is removed. The second planarization layer 16 of the display region 100 covers the anode connection electrode 17. The second planarization layer 16 is provided with a second connection via K2. The second planarization thin film in the second connection via K2 is removed to expose a surface of the anode connection electrode 17. The second connection via K2 is configured to connect an anode formed subsequently with the anode connection electrode through the via.

In an exemplary implementation mode, patterning the second planarization thin film may include first performing an exposure processing on the second planarization thin film and then performing a development processing on the second planarization thin film after the exposure processing to form a patterned second planarization layer 16.

In an exemplary implementation mode, the second planarization layer may be made of an organic material, such as resin.

Figure 14:
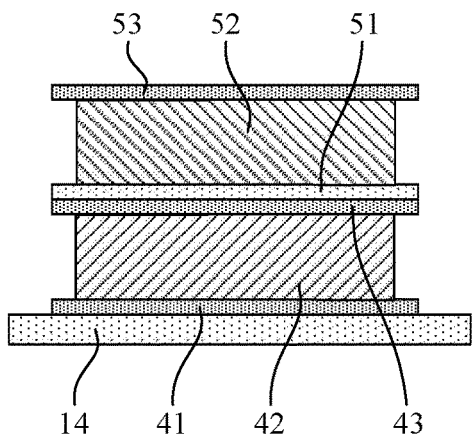
FIG. 14 is a schematic diagram of a structure of a first partition dam and a second partition dam in FIG. 13.

FIG. 14 is a schematic diagram of a structure of a first partition dam and a second partition dam in FIG. 13. As shown in FIG. 14, in an exemplary implementation mode, a developing solution of the development process may be a strong alkaline solution. Since a side surface of the first partition layer 40 and a side surface of the second partition layer 50 are exposed after the second planarization thin film of the partition region 220 is removed, side surfaces of the first partition layer 40 and the second partition layer 50 will be eroded by the developing solution under an action of the strong alkali solution. For the first partition layer 40 and the second partition layer 50 using a multi-layer composite structure of Ti/Al/Ti, since a rate of eroding an aluminum layer by the developing solution is greater than a rate of eroding a titanium layer by the developing solution, a side surface pit will be formed on a side surface of the eroded second partition layer 50, and the above of the aluminum layer and the titanium layer above the aluminum layer protrude the aluminum layer by a distance, forming a "⊥"-shaped structure.

In an exemplary implementation mode, in the second partition layer 50 with the "⊥"-shaped structure, a width of the second metal sub-layer 52 may be smaller than a width of the first metal sub-layer 51, and an orthographic projection of the second metal sub-layer 52 on the base substrate may be within a range of an orthographic projection of the first metal sub-layer 51 on the base substrate. The width of the second metal sub-layer 52 may be smaller than a width of the third metal sub-layer 53, and the orthographic projection of the second metal sub-layer 52 on the base substrate may be within a range of an orthographic projection of the third metal sub-layer 53 on the base substrate.

In an exemplary implementation mode, a width of the first metal sub-layer 51 may be equal to a width of the third conductive sub-layer 43, a side surface of the first metal sub-layer 51 and a side surface of the third conductive sub-layer 43 may be flush, and an orthographic projection of the first metal sub-layer 51 on the base substrate and an orthographic projection of the third conductive sub-layer 43 on the base substrate may be substantially overlapped.

In an exemplary implementation mode, a fifth insulation layer covering the anode connection electrode 17 may be formed first, and then a second planarization layer 16 is formed on the fifth insulation layer, and the fifth insulation layer may be formed only in the display region 100, and the present disclosure is not limited herein. In an exemplary implementation mode, the fifth insulation layer may be made of any one or more of Silicon Oxide (SiOx), Silicon Nitride (SiNx), and Silicon Oxynitride (SiON), and may be a single-layer, a multi-layer, or a composite layer. The fifth insulation layer may be referred to as a Passivation (PVX) layer.

So far, preparation of patterns of a drive structure layer 101 of the display region 100 and a hole region structure layer 201 of the partition region 220 are completed.

In an exemplary implementation mode, the drive structure layer 101 of the display region 100 may include a first insulation layer 11, a semiconductor layer, a second insulation layer 12, a first conductive layer, a third insulation layer 13, a second conductive layer, a fourth insulation layer 14, a third conductive layer, a first planarization layer 15, a fourth conductive layer, and a second planarization layer 16 stacked in sequence on a base substrate 10. The semiconductor layer may include a first active layer, the first conductive layer may include a first gate electrode and a first electrode plate, the second conductive layer may include a second electrode plate, the third conductive layer may include a first source electrode and a first drain electrode, the fourth conductive layer may include an anode connection electrode, and anode connection electrode is connected with the first drain electrode through a first connection via.

In an exemplary implementation mode, the hole region structure layer 201 of the partition region 220 may include a composite insulation layer, a first partition layer 40, and a second partition layer 50 stacked in sequence on the base substrate 10. The first partition layer 40 is disposed on a side of the composite insulation layer away from the base substrate; the second partition layer 50 is disposed on a side of the first partition layer 40 away from the base substrate, and the first partition layer 40 and the second partition layer 50 that are stacked form a partition dam structure. The first partition layer 40 and the third conductive layer in the drive structure layer 101 may be provided in a same layer and formed simultaneously through a same patterning process, and the second partition layer 50 and the fourth conductive layer in the drive structure layer 101 may be provided in a same layer and formed simultaneously through a same patterning process.

(15) Forming a pattern of an anode conductive layer. In an exemplary implementation mode, the forming the pattern of the anode conductive layer may include: an anode conductive thin film is deposited on the base substrate on which the aforementioned patterns are formed, the anode conductive thin film is patterned through a patterning process to form the pattern of the anode conductive layer, as shown in FIG. 15.

In an exemplary implementation mode, the pattern of the anode conductive layer may include at least an anode 21 located in the display region 100, wherein the anode 21 is connected with the anode connection electrode 17 through the second connection via K2.

In an exemplary implementation mode, the anode conductive layer (AND) may be made of a metal material or a transparent conductive material, and the metal material may include any one or more of silver (Ag), copper (Cu), aluminum (Al), titanium (TI), and molybdenum (Mo), or an alloy material of the above metals, and the transparent conductive material may include Indium Tin Oxide (ITO) or Indium Zinc Oxide (IZO). In an exemplary implementation mode, the anode conductive layer may have a single-layer structure or a multi-layer composite structure, such as ITO/Al/ITO.

Figure 15:
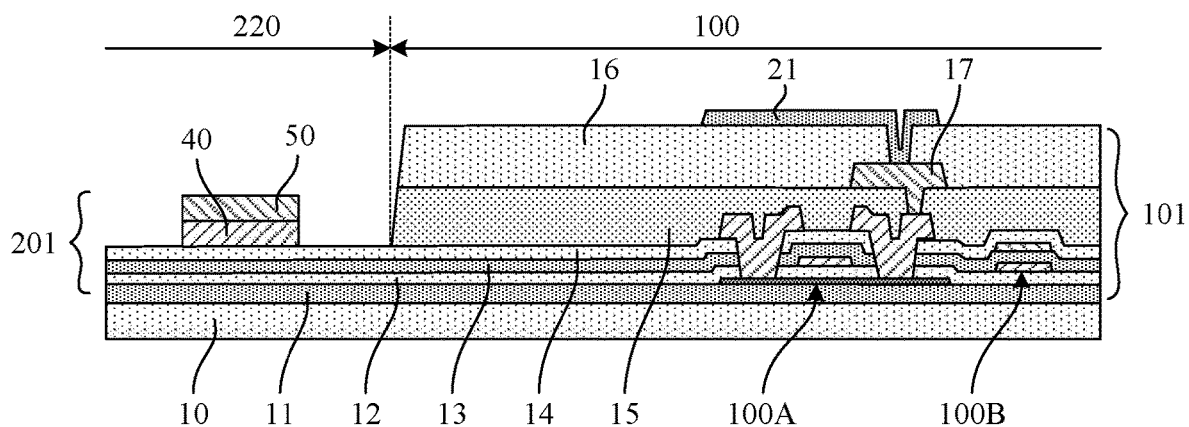
FIG. 15 is a schematic diagram of a pattern of an anode conductive layer according to an embodiment of the present disclosure.
Figure 16:
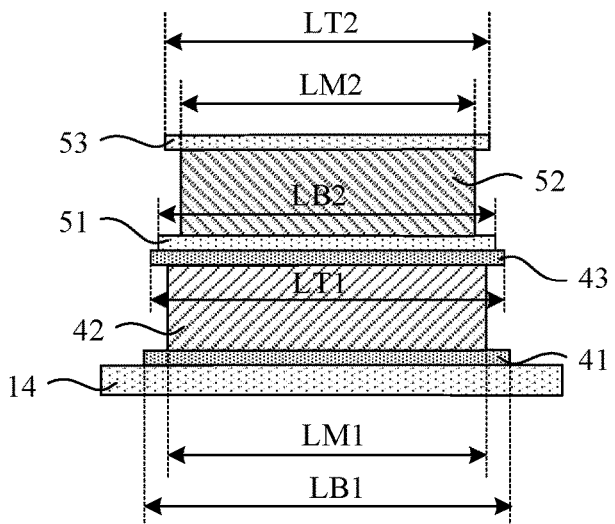
FIG. 16 is a schematic diagram of a structure of a first partition layer and a second partition layer in FIG. 15.

FIG. 16 is a schematic diagram of a structure of a first partition layer and a second partition layer in FIG. 15. As shown in FIG. 16, in an exemplary implementation mode, a wet etching process may be used for an etching process in patterning an anode conductive thin film. Since side surfaces of the first partition layer 40 and the second partition layer 50 are exposed after the anode conductive thin film of the partition region 220 is removed, the side surface of the first second partition layer 40 and the second partition layer 50 will be etched by an etching solution under an action of the etching solution. Since a rate of etching an aluminum layer by the etching solution is higher than a rate of etching a titanium layer by the etching solution, side surface pits of the first partition layer 40 and the second partition layer 50 are aggravated, the above of the aluminum layer and the titanium layer above the aluminum layer protrude from the aluminum layer by a distance, and the first partition layer 40 and the second partition layer 50 respectively form a "⊥"-shaped structure.

In an exemplary implementation mode, since the second partition layer 50 is located on a side of the first partition layer 40 away from the base substrate, a degree of etching the second partition layer 50 by an etching solution is greater than a degree of etching the first partition layer 40 by the etching solution. That is, an etching amount of the second metal sub-layer 52 in the second partition layer 50 is greater than an etching amount of the second conductive sub-layer 42 in the first partition layer 40, and an etching amount of the first metal sub-layer 51 and the third metal sub-layer 53 in the second partition layer 50 is greater than an etching amount of the first conductive sub-layer 41 and the third conductive sub-layer 43 in the first partition layer 40.

In an exemplary implementation mode, a width LT2 of the third metal sub-layer 53 may be less than or equal to a width LB2 of the first metal sub-layer 51 along a direction away from the function hole, and an orthographic projection of the third metal sub-layer 53 on the base substrate may be within a range of an orthographic projection of the first metal sub-layer 51 on the base substrate.

In an exemplary implementation mode, a width LM2 of the second metal sub-layer 52 may be smaller than a width LB2 of the first metal sub-layer 51 along a direction away from the function hole, and an orthographic projection of the second metal sub-layer 52 on the base substrate may be within a range of an orthographic projection of the first metal sub-layer 51 on the base substrate.

In an exemplary implementation mode, a width LM2 of the second metal sub-layer 52 may be smaller than a width LT2 of the third metal sub-layer 53 along a direction away from the function hole, and an orthographic projection of the second metal sub-layer 52 on the base substrate may be within a range of an orthographic projection of the third metal sub-layer 53 on the base substrate.

In an exemplary implementation mode, a width LT1 of the third conductive sub-layer 43 may be less than or equal to a width LB1 of the first conductive sub-layer 41 along a direction away from the function hole, and an orthographic projection of the third conductive sub-layer 43 on the base substrate may be within a range of an orthographic projection of the first conductive sub-layer 41 on the base substrate.

In an exemplary implementation mode, a width LM1 of the second conductive sub-layer 42 may be smaller than a width LB1 of the first conductive sub-layer 41 along a direction away from the function hole, and an orthographic projection of the second conductive sub-layer 42 on the base substrate may be within a range of an orthographic projection of the first conductive sub-layer 41 on the base substrate.

In an exemplary implementation mode, a width LM1 of the second conductive sub-layer 42 may be smaller than a width LT1 of the third conductive sub-layer 43 along a direction away from the function hole, and an orthographic projection of the second conductive sub-layer 42 on the base substrate may be within a range of an orthographic projection of the third conductive sub-layer 43 on the base substrate.

In an exemplary implementation mode, a width LB2 of the first metal sub-layer 51 may be smaller than a width LB1 of the first conductive sub-layer 41 along a direction away from the function hole, and an orthographic projection of the first metal sub-layer 51 on the base substrate may be within a range of an orthographic projection of the first conductive sub-layer 41 on the base substrate.

In an exemplary implementation mode, a width LM2 of the second metal sub-layer 52 may be smaller than a width LM1 of the second conductive sub-layer 42 along a direction away from the function hole, and an orthographic projection of the second conductive sub-layer 42 on the base substrate may be within a range of an orthographic projection of the second metal sub-layer 52 on the base substrate.

In an exemplary implementation mode, a width LT2 of the third metal sub-layer 53 may be smaller than a width LT1 of the third conductive sub-layer 43 along a direction away from the function hole, and an orthographic projection of the third metal sub-layer 53 on the base substrate may be within a range of an orthographic projection of the third conductive sub-layer 43 on the base substrate.

In an exemplary implementation mode, a width LB2 of the first metal sub-layer 51 may be less than or equal to a width LT1 of the third conductive sub-layer 43 along a direction away from the function hole, and an orthographic projection of the first metal sub-layer 51 on the base substrate may be within a range of an orthographic projection of the third conductive sub-layer 43 on the base substrate.

In an exemplary implementation mode, a width LB1 of the first conductive sub-layer 41 may be about 5.0 µm to 5.8 µm, a width LM1 of the second conductive sub-layer 42 may be about 4.2 µm to 4.8 µm, a width LB1 of the third conductive sub-layer 43 may be about 4.8 µm to 5.6 µm, a width LB2 of the first metal sub-layer 51 may be about 4.6 µm to 5.4 µm, a width LM2 of the second metal sub-layer 52 may be about 3.8 µm to 4.6 µm, and a width LT2 of the third metal sub-layer 53 may be about 4.4 µm to 5.2 µm. For example, the width LB1 of the first conductive sub-layer 41 may be about 5.4 µm, the width LM1 of the second conductive sub-layer 42 may be about 4.6 µm, the width LT1 of the third conductive sub-layer 43 may be about 5.2 µm, the width LB2 of the first metal sub-layer 51 may be about 5.0 µm, the width LM2 of the second metal sub-layer 52 may be about 4.2 µm, and the width LT2 of the third metal sub-layer 53 may be about 4.8 µm.

Figure 17:
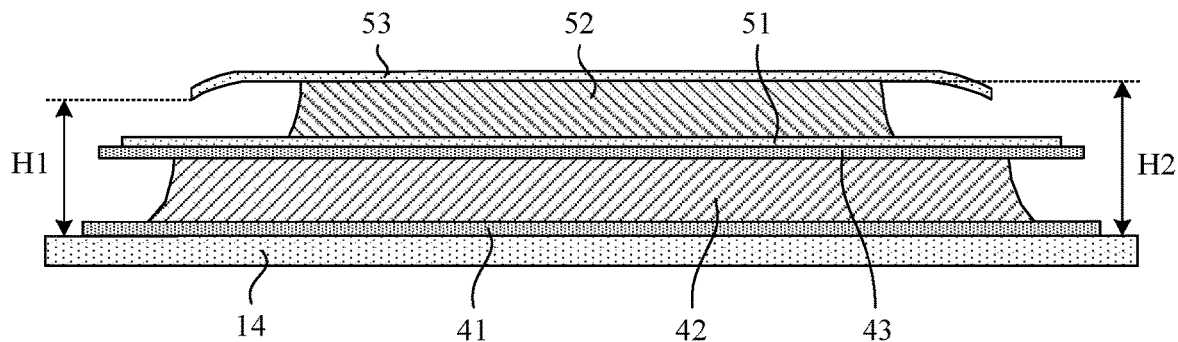
FIG. 17 is another schematic diagram of a structure of a first partition layer and a second partition layer in FIG. 15.

FIG. 17 is another schematic diagram of a structure of a first partition layer and a second partition layer in FIG. 15. As shown in FIG. 17, since the second partition layer 50 is located on a side of the first partition layer 40 away from the base substrate, not only a degree of etching the second partition layer 50 by an etching solution is greater than a degree of etching the first partition layer 40 by the etching solution, but also for the second conductive sub-layer 42 and the second metal sub-layer 52, an etching degree of a region on a side away from the base substrate is greater than an etching degree of a region on a side close to the base substrate, so that a cross-sectional shape of the second conductive sub-layer 42 and the second metal sub-layer 52 is a shape of a trapezoid.

In an exemplary implementation mode, a sidewall in a shape of a trapezoid may be in a shape of a straight line or may be in a shape of an arc line.

In an exemplary implementation mode, since a cross-sectional shape of the second metal sub-layer 52 is a shape of a trapezoid, a portion of the third metal sub-layer 53 protruding from the second metal sub-layer 52 is in an arc shape drooping toward a direction of the base substrate due to loss of support.

In an exemplary implementation mode, a distance H1 between an edge of the third metal sub-layer 53 and the base substrate may be less than a distance H2 between a surface of the second metal sub-layer 52 on a side away from the base substrate and the base substrate. The edge of the third metal sub-layer 53 refers to an edge of the third metal sub-layer 53 on a side close to the display region and an edge of the third metal sub-layer 53 on a side away from the display region.

Figure 18:
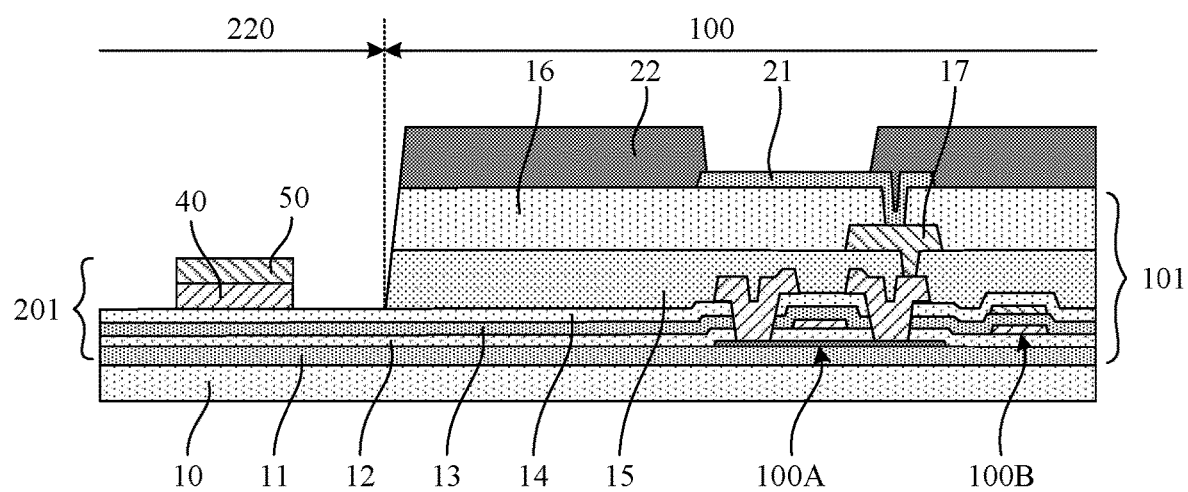
FIG. 18 is a schematic diagram after a pattern of a pixel definition layer is formed according to an embodiment of the present disclosure.

(16) Forming a pattern of a Pixel Definition Layer (PDL).
In an exemplary implementation mode, the forming the pattern of the pixel definition layer may include: a pixel definition thin film is coated on the base substrate on which the aforementioned patterns are formed; the pixel definition thin film is patterned through a patterning process, so as to form a pattern of a pixel definition layer 22, as shown in FIG. 18.

In an exemplary implementation mode, the pixel definition layer 22 may be formed only in the display region 100 and the pixel definition thin film of the partition region 220 is removed. A pixel opening is provided on the pixel definition layer 22 of each sub-pixel in the display region 100, and the pixel definition thin film in the pixel opening is removed to expose a surface of an anode 21 of the sub-pixel.

In an exemplary implementation mode, a material of the pixel definition layer may include polyimide, acrylic, or the like. In an exemplary implementation mode, a patterning process of a half tone mask may be adopted to form a pattern of a post spacer when forming the pixel definition layer, wherein the post spacer may be disposed on an outside of the pixel opening, and the post spacer is configured to support a fine metal mask in a subsequent evaporation process. The present disclosure is not limited herein.

In an exemplary implementation mode, in a plane parallel to the base substrate, a shape of the pixel opening may be a rectangle, a square, a pentagon, a hexagon, a circle, an ellipse, or the like. In a plane perpendicular to the base substrate, a cross-sectional shape of the pixel opening may be a rectangle, a trapezoid, or the like, and an inner sidewall of the pixel opening may be a plane or an arc surface, which is not limited in the present disclosure.

(17) Forming a pattern of an organic emitting layer. In an exemplary implementation mode, the forming the pattern of the organic emitting layer may include: patterns of an organic emitting layer 23 and an organic emitting block 24 are formed by means of evaporation or ink-jet printing on the base substrate on which the above-mentioned patterns are formed, as shown in FIG. 19.

In an exemplary implementation mode, the organic emitting layer 23 may be located in the display region 100 and the partition region 220, the organic emitting layer 23 of the display region 100 may be connected with an anode 21 of a sub-pixel where it is located through a pixel opening, and the organic emitting layer 23 of the partition region 220 may be located in a region outside a partition dam structure of the partition region 220. In an exemplary implementation mode, the organic emitting block 24 may be located on a side of the partition dam structure of the partition region 220 away from the base substrate, and the organic emitting block 24 and the organic emitting layer 23 in the partition region 220 are isolated from each other.

Figure 19:
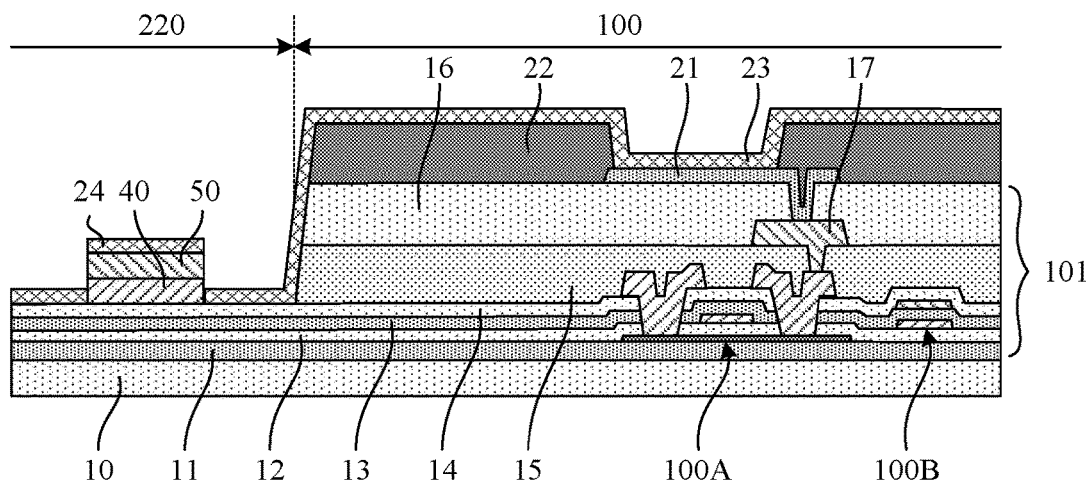
FIG. 19 is a schematic diagram after a pattern of an organic emitting layer is formed according to an embodiment of the present disclosure.
Figure 20:
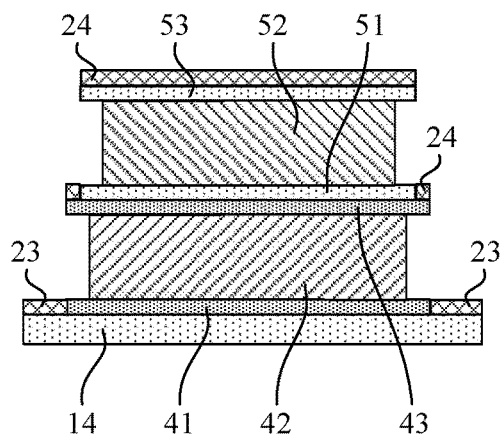
FIG. 20 is a schematic diagram of an organic light emitting material being partitioned by a partition dam in FIG. 19.

FIG. 20 is a schematic diagram of an organic light emitting material being partitioned by a partition dam in FIG. 19. As shown in FIG. 20, since the second partition layer 50 in the partition dam structure has a "⊥"-shaped structure and the third metal sub-layer 53 of an upper layer has an "eave" structure protruding from the second metal sub-layer 52, the organic light emitting material is disconnected at the "eave" structure of the second partition layer 50, and an organic emitting block 24 is formed on a side of the third metal sub-layer 53 away from the base substrate. In an exemplary implementation mode, an orthographic projection of the organic emitting block 24 on the base substrate may be substantially overlapped with an orthographic projection of the third metal sub-layer 53 on the base substrate.

In an exemplary implementation mode, since the first partition layer 40 in the partition dam structure has a "⊥"-shaped structure and the third conductive sub-layer 43 of an upper layer has an "eave" structure protruding from the second conductive sub-layer 42, even if the organic light emitting material is not disconnected at the "eave" structure of the second partition layer 50, the organic light emitting material is disconnected at the "eave" structure of the first partition layer 40, and an organic emitting block 24 is formed on a side of the third conductive sub-layer 43 away from the base substrate, effectively ensuring that the organic emitting block 24 and the organic emitting layer 23 are isolated from each other. In the present disclosure, a disconnection between the organic emitting block 24 and the organic emitting layer 23 is ensured to a greatest extent by arranging a partition dam with stacked double "⊥"-shaped structures, which may cut off a transmission channel of water and oxygen, effectively block invasion of water and oxygen, and ensure effectiveness and reliability of encapsulation.

In an exemplary implementation mode, compared with a case in which a partition dam structure only includes the first partition layer 40 or a partition dam structure only includes the second partition layer 50, since the partition dam structure includes the first partition layer 40 and the second partition layer 50 which are stacked, a height of the partition dam structure is relatively large, performance of partitioning the organic light emitting material is improved to a greatest extent, and effectiveness and reliability of encapsulation are effectively improved.

In an exemplary implementation mode, the organic emitting layer may include an Emitting Layer (EML), and any one or more of following: a Hole Injection Layer (HIL), a Hole Transport Layer (HTL), an Electron Block Layer (EBL), a Hole Block Layer (HBL), an Electron Transport Layer (ETL), and an Electron Injection Layer (EIL).

In an exemplary implementation mode, the organic emitting layer may be prepared through a following preparation method. Firstly, a hole injection layer, a hole transport layer, and an electron block layer are formed sequentially using an evaporation process of an Open Mask (OPM) or an ink-jet printing process, and a common layer of the hole injection layer, the hole transport layer, and the electron block layer is formed on the display substrate. Then, a red emitting layer, a green emitting layer, and a blue emitting layer are respectively formed in corresponding sub-pixels using an evaporation process of a Fine Metal Mask (FMM) or an ink-jet printing process. Emitting layers of adjacent sub-pixels may be overlapped slightly (e.g. an overlapping portion accounts for less than 10% of an area of a respective pattern of an emitting layer) or may be isolated. Subsequently, a hole block layer, an electron transport layer, and an electron injection layer are formed in sequence using an evaporation process of an open mask or an ink-jet printing process. A common layer of the hole blocking layer, the electron transport layer, and the electron injection layer is formed on the display substrate.

In an exemplary implementation mode, the organic emitting layer may include a microcavity adjustment layer, so that a thickness of the organic emitting layer between a cathode and an anode satisfies a design of a length of a microcavity. In an exemplary implementation mode, a hole transport layer, an electron block layer, a hole block layer, or an electron transport layer may be used as a microcavity adjustment layer, which is not limited in the present disclosure.

In an exemplary implementation mode, the emitting layer may include a host material and a dopant material doped into the host material. A doping ratio of the dopant material of the emitting layer is 1% to 20%. Within a range of the doping ratio, on one hand, the host material of the emitting layer may effectively transfer exciton energy to the dopant material of the emitting layer to excite the dopant material of the emitting layer to emit light; on the other hand, the host material of the emitting layer "dilutes" the dopant material of the emitting layer, thus effectively improving fluorescence quenching caused by collisions between molecules of the dopant material of the emitting layer and collisions between energies, and improving a luminous efficiency and device life. In an exemplary implementation mode, the doping ratio refers to a ratio of a mass of the dopant material to a mass of the emitting layer, that is, a mass percentage. In an exemplary implementation mode, the host material and the dopant material may be co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process. In an exemplary implementation mode, a thickness of the emitting layer may be about 10 nm to 50 nm.

In an exemplary implementation mode, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide, or may be made of a p-type dopant of a strong electron withdrawing system and a dopant of a hole transport material. In an exemplary implementation mode, a thickness of the hole injection layer may be about 5 nm to 20 nm.

In an exemplary implementation mode, the hole transport layer may be made of a material with a relatively high hole mobility, such as an aromatic amine compound, and its substituent group may be carbazole, methylfluorene, spirofluorene, dibenzothiophene, furan, or the like. In an exemplary implementation mode, a thickness of the hole transport layer may be about 40 nm to 150 nm.

In an exemplary implementation mode, the hole block layer and the electron transport layer may be made of aromatic heterocyclic compounds, such as benzimidazole derivatives, imidazopyridine derivatives, benzimidazophenanthridine derivatives, and other imidazole derivatives; pyrimidine derivatives, triazine derivatives, and other azine derivatives; compounds having a nitrogen-containing six-membered ring structure (also including compounds having a phosphine oxide-based substituent on a heterocyclic ring) such as quinoline derivatives, isoquinoline derivatives, and phenanthroline derivatives. In an exemplary implementation mode, a thickness of the hole block layer may be about 5 nm to 15 nm, and a thickness of the electron transport layer may be about 20 nm to 50 nm.

In an exemplary implementation mode, the electron injection layer may be made of an alkali metal or a metal, such as lithium fluoride (LiF), ytterbium (Yb), magnesium (Mg), or Calcium (Ca), or a compound of these alkali metals or metals. In an exemplary implementation mode, a thickness of the electron injection layer may be about 0.5 nm to 2 nm.

(18) Forming a pattern of a cathode. In an exemplary implementation mode, the forming the pattern of the cathode may include: on the base substrate on which the aforementioned patterns are formed, patterns of a cathode 25 and a cathode block 26 are formed by means of evaporation of an open mask, as shown in FIG. 21.

In an exemplary implementation mode, the cathode 25 may be located in the display region 100 and the partition region 220, and may have a whole surface structure. The cathode 25 of the display region 100 is connected with the organic emitting layer 23, enabling the organic emitting layer to be connected with the anode and the cathode simultaneously. The cathode 25 of the partition region 220 may be located in a region outside the partition dam structure of the partition region 220, the cathode block 26 of the partition region 220 may be located on a side of the organic emitting block 24 away from the base substrate, and the cathode block 26 and the cathode 25 in the partition region 220 are isolated from each other.

Figure 21:
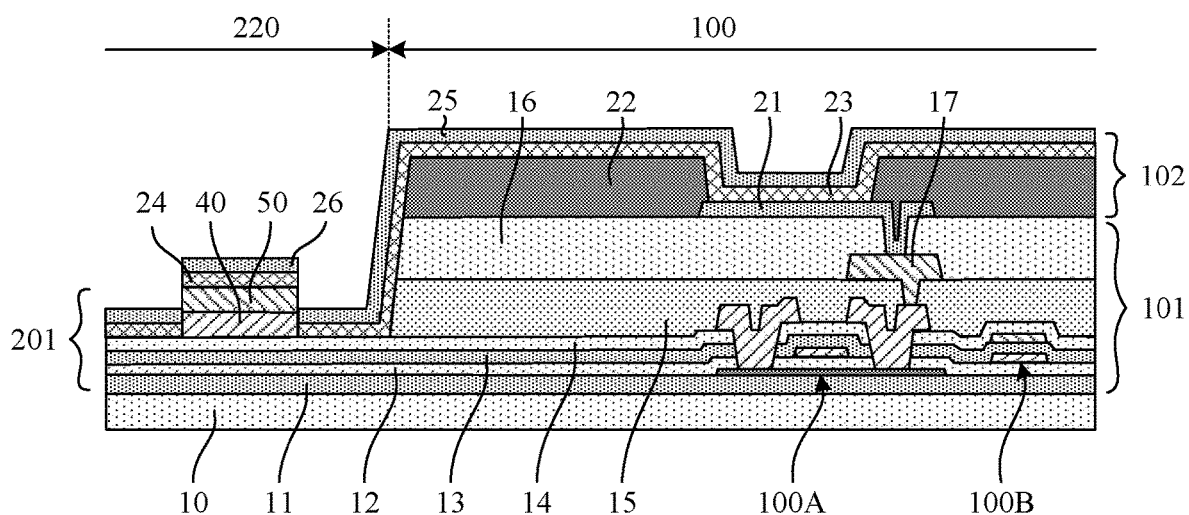
FIG. 21 is a schematic diagram after a pattern of a cathode is formed according to an embodiment of the present disclosure.
Figure 22:
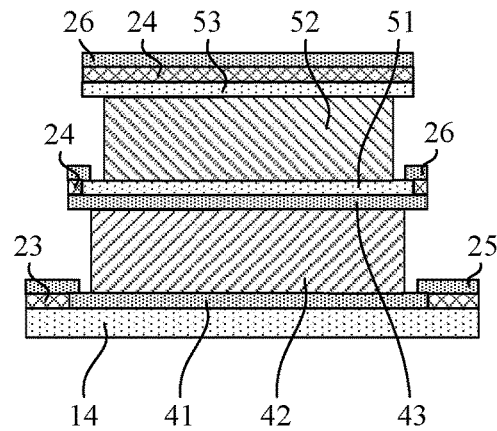
FIG. 22 is a schematic diagram of a cathode being partitioned by a partition dam in FIG. 21.

FIG. 22 is a schematic diagram of a cathode being partitioned by a partition dam in FIG. 21. As shown in FIG. 22, since the second partition layer 50 in the partition dam structure has a "⊥"-shaped structure and the third metal sub-layer 53 of an upper layer has an "eave" structure protruding from the second metal sub-layer 52, a cathode material is disconnected at the "eave" structure of the second partition layer 50, and the cathode block 26 is formed on a side of the organic emitting block 24 away from the base substrate. In an exemplary implementation mode, an orthographic projection of the cathode block 26 on the base substrate may be substantially overlapped with an orthographic projection of the organic light emitting block 24 on the base substrate In an exemplary implementation mode, since the first partition layer 40 in the partition dam structure has a "⊥"-shaped structure and the third conductive sub-layer 43 of an upper layer has an "eave" structure protruding from the second conductive sub-layer 42, even if the cathode material is not disconnected at the "eave" structure of the second partition layer 50, the cathode material is disconnected at the "eave" structure of the first partition layer 40, and the cathode block 26 is formed on a side of the organic emitting block 24 away from the base substrate, effectively ensuring mutual isolation between the cathode block 26 and the cathode 25. In the present disclosure, a disconnection between the cathode block 26 and the cathode 25 is ensured to a greatest extent by arranging a partition dam structure with stacked double "⊥"-shaped structures, which may cut off a transmission channel of water and oxygen, effectively block invasion of water and oxygen, and ensure effectiveness and reliability of encapsulation.

In an exemplary implementation mode, compared with a case in which a partition dam structure only includes the first partition layer 40 or a partition dam structure only includes the second partition layer 50, since the partition dam structure includes the first partition layer 40 and the second partition layer 50 which are stacked, a height of the partition dam structure is relatively large, performance of partitioning the cathode material is improved to a greatest extent, and effectiveness and reliability of encapsulation are improved to a greatest extent.

In an exemplary implementation mode, the cathode may be made of any one or more of magnesium (Mg), silver (Ag), aluminum (Al), copper (Cu), and lithium (Li), or an alloy made of any one or more of the above metals.

In some possible exemplary implementation modes, a pattern of an optical coupling layer may be formed after the pattern of the cathode is formed. The optical coupling layer is disposed on the cathode. A refractive index of the optical coupling layer may be greater than a refractive index of the cathode, which facilitates light extraction and increases a light output efficiency. A material of the optical coupling layer may be an organic material, or an inorganic material, or an organic material and an inorganic material, and may be a single layer, a multi-layer, or a composite layer, which is not limited in the present disclosure.

Hereto, preparation of the pattern of the emitting structure layer 102 is completed. The emitting structure layer 102 of the display region 100 may include the anode 21, the pixel definition layer 22, the organic emitting layer 23, and the cathode 25. The organic emitting layer 23 is disposed between the anode 21 and the cathode 25.

(19) Forming a pattern of an encapsulation structure layer. In an exemplary implementation mode, the forming pattern of the encapsulation structure layer may include: a first encapsulation thin film is first deposited using an open mask deposition manner, and a pattern of a first encapsulation layer 31 is formed in the display region 100 and the partition region 220, the first encapsulation layer 31 of the display region 100 covers the cathode 25, and the first encapsulation layer 31 of the display region 100 covers the partition dam structure. Subsequently, a second encapsulation material is printed using an ink-jet printing process and a pattern of a second encapsulation layer 32 is formed in the display region 100, the second encapsulation layer 32 of the display region 100 is disposed on the first encapsulation layer 31. Subsequently, a third encapsulation thin film is deposited using an open mask deposition manner, and a pattern of a third encapsulation layer 33 is formed on the display region 100 and the partition region 220. The third encapsulation layer 33 of the display region 100 is disposed on the second encapsulation layer 32, and the third encapsulation layer 33 of the partition region 220 is disposed on an outside of the first encapsulation layer 31 wrapping the partition dam structure, as shown in FIG. 23.

In an exemplary implementation mode, the first encapsulation layer and the third encapsulation layer may be made of any one or more of following: Silicon Oxide (SiOx), Silicon Nitride (SiNx), and Silicon Oxynitride (SiON), may be a single layer, a multi-layer, or a composite layer, may adopt Chemical Vapor Deposition (CVD), or Atomic Layer Deposition (ALD), etc., and may ensure that external water and oxygen cannot enter the emitting structure layer. The second encapsulation layer may be made of an organic material, such as a resin, playing a role of covering each film layer of the display region so as to improve structural stability and planarization. In this way, the first encapsulation layer, the second encapsulation layer, and the third encapsulation layer that are stacked form the encapsulation structure layer, and the formed laminated structure of an inorganic material/an organic material/an inorganic material may ensure integrity of encapsulation and effectively isolate external water and oxygen.

Figure 23:
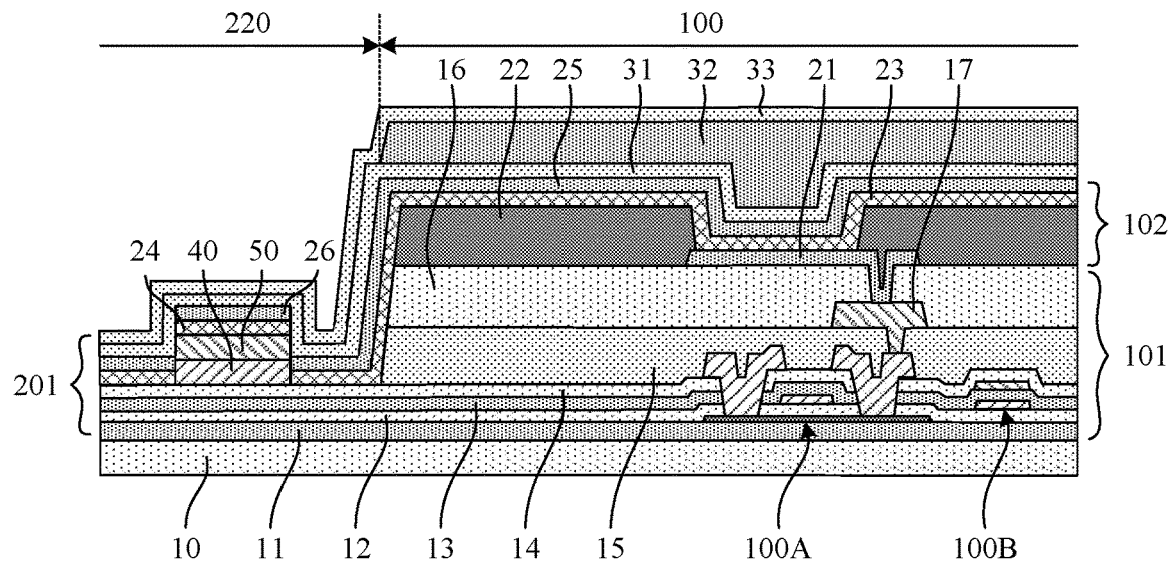
FIG. 23 is a schematic diagram after a pattern of an encapsulation structure layer is formed according to an embodiment of the present disclosure.
Figure 24:
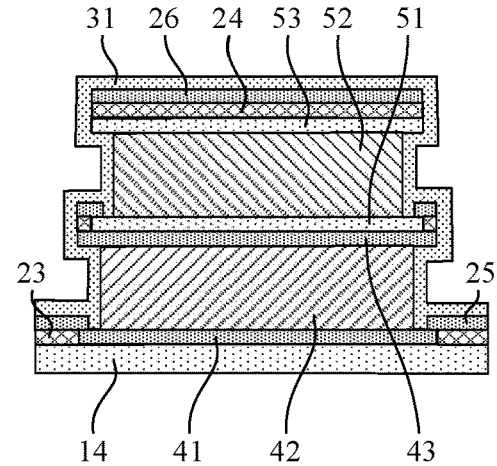
FIG. 24 is a schematic diagram of a first encapsulation layer wrapping a partition dam structure in FIG. 23.

FIG. 24 is a schematic diagram of a first encapsulation layer wrapping the partition dam structure in FIG. 23. As shown in FIG. 24, the first encapsulation layer 31 wrapping the partition dam structure means that the first encapsulation layer 31 covers an entire exposed surface of the partition dam structure. That is, the first encapsulation layer 31 covers the cathode block 26 on a side of the partition dam structure away from the base substrate, covers an inner surface on a side of the partition dam structure facing the display region 100, and covers an outer surface on a side of the partition dam structure away from the display region 100, forming complete wrapping of the partition dam structure by the first encapsulation layer 31. In the exemplary embodiment of the present disclosure, the partition dam structure is provided and the partition dam structure is completely wrapped by the first encapsulation layer and the third encapsulation layer, which may cut off a transmission channel of water and oxygen, effectively block invasion of water and oxygen, and ensure effectiveness and reliability of encapsulation.

So far, the pattern of the encapsulation structure layer is formed to ensure integrity of encapsulation and effectively isolate external water and oxygen. In the display region 100, the encapsulation structure layer may include a first encapsulation layer, a second encapsulation layer, and a third encapsulation layer that are stacked to form a laminated structure of an inorganic material/an organic material/an inorganic material. The encapsulation structure layer in the partition region 220 may include a first encapsulation layer and a third encapsulation layer that are stacked to form a laminated structure of an inorganic material/an inorganic material.

In an exemplary implementation mode, after preparation of an encapsulation layer is completed, a touch structure layer (TSP) may be formed on the encapsulation layer, and the touch structure layer may include a touch electrode layer, or include a touch electrode layer and a touch insulation layer, which is not limited in the present disclosure.

In an exemplary implementation mode, during preparation of a flexible display substrate, a preparation process of the display substrate may further include a process such as attaching a back film and cutting, which is not limited in the present disclosure.

In the display substrate, the third conductive layer (SD1) is used in the partition region 220 to form several circles of partition dams, which not only requires relatively high process margins, but also has an effective partition effect of the partition dam structure. Especially, when reliability requirements are getting stricter and reliability test time is getting longer and longer, there is still a risk that water vapor will be transmitted to the display region after passing through a single-layer partition dam. In addition, since a height of the single-layer partition dam with a "⊥"-shaped structure is relatively low, in a subsequent process for forming a first encapsulation layer and a third encapsulation layer by means of deposition, not only an "eave" structure on an upper side of the "⊥"-shaped structure will block particles of vapor deposition, so that a side surface pit of the single-layer partition dam cannot be filled with an encapsulation material and form a void hole, but also a slope of a sidewall of the "⊥"-shaped structure is relatively large, causing cracks (CVD cracks) in the first encapsulation layer and the third encapsulation layer. After external water vapor enters a void hole or a crack, the water vapor will diffuse to the display region, resulting in product failure.

As may be seen from the structure of the display substrate and the preparation process thereof in the exemplary embodiment of the present disclosure, the partition dam structure of the exemplary embodiment of the present disclosure includes a first partition layer formed by a third conductive layer (SD1) and a second partition layer formed by a fourth conductive layer (SD2). A height of the partition dam structure is about a sum of thicknesses of the third conductive layer and the fourth conductive layer. The height of the partition dam structure is relatively large, which not only effectively reduces requirements for process margins, but also effectively improves a partition effect of the partition dam structure, eliminates a risk of water vapor being transmitted to the display region after passing through the partition dam structure, and effectively improves effectiveness and reliability of encapsulation. In the present disclosure, the height of the partition dam structure is increased, so that in a subsequent process of forming the first encapsulation layer and the third encapsulation layer by means of deposition, swirling space of vapor deposition particles is relatively large, so that it is easy for an encapsulation material to be filled in a side surface pit of a partition dam, and formation of a void hole is avoided. In the present disclosure, both the first partition layer and the second partition layer are set to be of a "⊥"-shaped structure. Double-layer stacked "⊥"-shaped structures form at least two "eave" structures, which not only ensures cut off of an organic light emitting material to a greatest extent and improves a partition effect of the partition dam structure, but also enhances abilities of the first encapsulation layer and the third encapsulation layer to resist shear stresses to a greatest extent, which may effectively avoid peeling failure of the first encapsulation layer and the third encapsulation layer. In the present disclosure, a width of the second partition layer is set to be smaller than a width of the first partition layer, that is, a width of the third metal sub-layer is smaller than a width of the third conductive sub-layer, a width of the second metal sub-layer is smaller than a of the second conductive sub-layer, and a width of the first metal sub-layer is smaller than a width of the first conductive sub-layer, so that a slope of a sidewall of the partition dam structure is reduced as a whole, effectively slowing down a slope of deposition of the first encapsulation layer and the third encapsulation layer, not only effectively avoiding formation of a void hole in the sidewall of the partition dam structure, but also effectively avoiding a crack appearing in the first encapsulation layer and the third encapsulation layer. According to the display substrate provided by the exemplary embodiment of the present disclosure, encapsulation failure may be effectively avoided, a production yield and product reliability of the display substrate are improved, and product quality and service life are improved. The preparation process of the display substrate of the exemplary embodiment of the present disclosure has good process compatibility, and a partition dam structure with a double-layer "⊥"-shaped structure is formed at the same time of forming a first planarization layer, a second planarization layer, and an anode through a patterning process, so that the process is simple to achieve, easy to implement, high in production efficiency, low in production cost, and high in yield.

Figure 25:
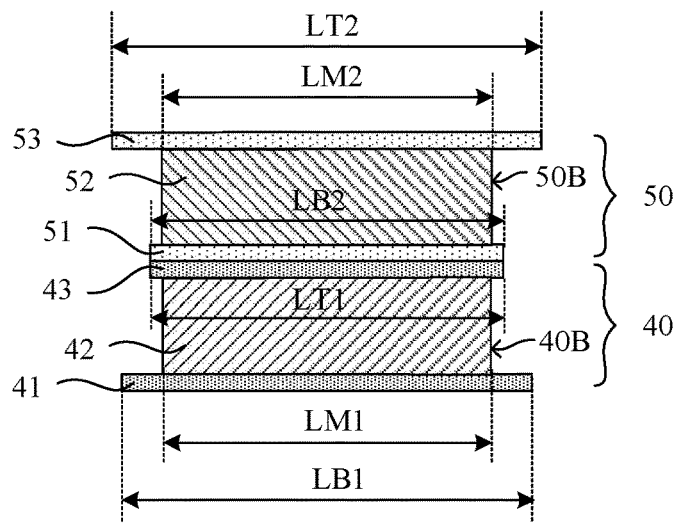
FIG. 25 is a schematic diagram of a structure of another partition dam according to an exemplary embodiment of the present disclosure.

FIG. 25 is a schematic diagram of a structure of another partition dam according to an exemplary embodiment of the present disclosure. As shown in FIG. 25, the partition dam of this exemplary embodiment may include a first partition layer 40 and a second partition layer 50 that are stacked. The first partition layer 40 may include a first conductive sub-layer 41, a second conductive sub-layer 42, and a third conductive sub-layer 43 that are stacked, and the second partition layer 50 may include a first metal sub-layer 51, a second metal sub-layer 52, and a third metal sub-layer 53 that are stacked. The first conductive sub-layer 41 and the third conductive sub-layer 43 have protrusions with respect to a sidewall 40B of the second conductive sub-layer 42, and upper and lower protrusions and the sidewall 40B of the second sub-layer form an inwardly recessed structure so that the first partition layer 40 forms a first "⊥"-shaped structure. The first metal sub-layer 51 and the third metal sub-layer 53 have protrusions with respect to a sidewall 50B of the second metal sub-layer 52, and upper and lower protrusions and the sidewall 50B of the second metal layer form an inwardly recessed structure, so that the second partition layer 50 forms a second "⊥"-shaped structure.

In an exemplary implementation mode, the first "⊥"-shaped structure and the second "⊥"-shaped structure disposed on a side of the first "⊥"-shaped structure away from a base substrate constitute a partition dam structure with stacked double "⊥"-shaped structures.

In an exemplary implementation mode, an overall width of an upper part of the partition dam structure and an overall width of a lower part of the partition dam structure may be greater than an overall width of a middle part of the partition dam structure, i.e. the partition dam structure has an overall shape with a relatively large upper part, a relatively large lower part, and a relatively small middle part, and a sidewall of the partition dam structure forms a "C" shape.

In an exemplary implementation mode, a width LT1 of the third conductive sub-layer 43 may be smaller than a width LB1 of the first conductive sub-layer 41, and an orthographic projection of the third conductive sub-layer 43 on the base substrate may be within a range of an orthographic projection of the first conductive sub-layer 41 on the base substrate.

In an exemplary implementation mode, a width LM1 of the second conductive sub-layer 42 may be smaller than a width LB1 of the first conductive sub-layer 41 and a width LT1 of the third conductive sub-layer 43 at the same time, and an orthographic projection of the second conductive sub-layer 42 on the base substrate may be within a range of an orthographic projection of the first conductive sub-layer 41 and a range of an orthographic projection of the third conductive sub-layer 43 on the base substrate at the same time.

In an exemplary implementation mode, a width LT2 of the third metal sub-layer 53 may be greater than a width LB2 of the first metal sub-layer 51, and an orthographic projection of the first metal sub-layer 51 on the base substrate may be within a range of an orthographic projection of the third metal sub-layer 53 on the base substrate.

In an exemplary implementation mode, a width LM2 of the second metal sub-layer 52 may be smaller than a width LB2 of the first metal sub-layer 51 and a width LT2 of the third metal sub-layer 53 at the same time, and an orthographic projection of the second metal sub-layer 52 on the base substrate may be within a range of an orthographic projection of the first metal sub-layer 51 and a range of an orthographic projection of the third metal sub-layer 53 on the base substrate at the same time.

In an exemplary implementation mode, a width LT2 of the third metal sub-layer 53 may be equal to a width LB1 of the first conductive sub-layer 41, and an orthographic projection of the third metal sub-layer 53 on the base substrate may be substantially the same as an orthographic projection of the first conductive sub-layer 41 on the base substrate.

In an exemplary implementation mode, a width LM2 of the second metal sub-layer 52 may be equal to a width LM1 of the second conductive sub-layer 42, and an orthographic projection of the second conductive sub-layer 42 on the base substrate may be substantially the same as an orthographic projection of the second metal sub-layer 52 on the base substrate.

In an exemplary implementation mode, a width LB2 of the first metal sub-layer 51 may be equal to a width LT1 of the third conductive sub-layer 43, and an orthographic projection of the first metal sub-layer 51 on the base substrate and an orthographic projection of the third conductive sub-layer 43 on the base substrate may be substantially the same.

In an exemplary implementation mode, a width LB1 of the first conductive sub-layer 41 may be about 5.0 µm to 5.8 µm, a width LM1 of the second conductive sub-layer 42 may be about 3.8 µm to 4.6 µm, a width LB1 of the third conductive sub-layer 43 may be about 4.0 µm to 4.8 µm, a width LB2 of the first metal sub-layer 51 may be about 4.0 µm to 4.8 µm, a width LM2 of the second metal sub-layer 52 may be about 3.8 µm to 4.6 µm, and a width LT2 of the third metal sub-layer 53 may be about 4.4 µm to 5.2 µm. For example, the width LB1 of the first conductive sub-layer 41 may be about 5.4 µm, the width LM1 of the second conductive sub-layer 42 may be about 4.2 µm, the width LT1 of the third conductive sub-layer 43 may be about 4.4 µm, the width LB2 of the first metal sub-layer 51 may be about 4.4 µm, the width LM2 of the second metal sub-layer 52 may be about 4.2 µm, and the width LT2 of the third metal sub-layer 53 may be about 4.8 µm.

In an exemplary implementation mode, the preparation process of the display substrate of this exemplary embodiment is substantially the same as that of the foregoing embodiments, and includes forming a transistor structure layer, a first planarization layer, a fourth conductive layer, a second planarization layer, an anode conductive layer, a pixel definition layer, an organic emitting layer, a cathode, and an encapsulation structure layer. A difference is that, during patterning of the anode conductive layer, first, the third metal sub-layer 53 in the second partition layer 50 is protected using an anode conductive thin film. The second metal sub-layer 52 and the first metal sub-layer 51 in the second partition layer 50, the first conductive sub-layer 41, the second conductive sub-layer 42, and the third conductive sub-layer 43 in the first partition layer 40 are etched through a wet etching process. Subsequently, etching is then continued through a dry etching process (e.g. $SF_6$), and the third conductive sub-layer 43 and the first metal sub-layer 51 may be mainly removed due to different rates of $SF_6$ on a titanium layer and an aluminum layer. Subsequently, the anode conductive thin film for protecting the third metal sub-layer 53 is etched through a wet etching process, and finally a partition dam structure with a sidewall of a "C" shape is formed.

In this exemplary embodiment, not only a partition effect of the partition dam structure is improved effectively by increasing a height of the partition dam structure, but also an encapsulation material layer may better cover a sidewall of a partition dam by forming a "C" shape on the sidewall of the partition dam, which may not only effectively avoid formation of a void hole on the sidewall of the partition dam, but also effectively avoid a crack appearing in the encapsulation material layer, thereby encapsulation failure can be effectively avoided, and a production yield and product reliability of the display substrate can be improved.

Figure 26:
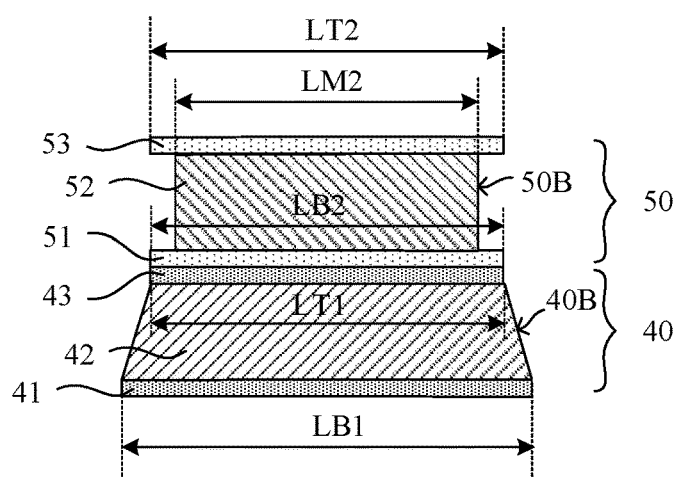
FIG. 26 is a schematic diagram of a structure of yet another partition dam according to an exemplary embodiment of the present disclosure.

FIG. 26 is a schematic diagram of a structure of yet another partition dam according to an exemplary embodiment of the present disclosure. As shown in FIG. 26, the partition dam of this exemplary embodiment may include a first partition layer 40 and a second partition layer 50 that are stacked. The first partition layer 40 may include a first conductive sub-layer 41, a second conductive sub-layer 42, and a third conductive sub-layer 43 that are stacked, and the second partition layer 50 may include a first metal sub-layer 51, a second metal sub-layer 52, and a third metal sub-layer 53 that are stacked. A cross-sectional shape of the first partition layer 40 has a trapezoidal structure, and a cross-sectional shape of the second partition layer 50 has a "⊥"-shaped structure. The trapezoidal structure and the "⊥"-shaped structure disposed on a side of the trapezoidal structure away from a base substrate together constitute a partition dam structure in which a lower trapezoidal structure and an upper "⊥"-shaped structure are stacked.

In an exemplary implementation mode, a cross-sectional shape of the second conductive sub-layer 42 is a trapezoid, including a first upper bottom on a side away from the base substrate, a first lower bottom on a side close to the base substrate, and a first sidewall 40B connected between the first upper bottom and the first lower bottom. In an exemplary implementation mode, the first sidewall 40B may be in a shape of a straight line or may be in a shape of an arc line.

In an exemplary implementation mode, the first metal sub-layer 51 and the third metal sub-layer 53 have protrusions with respect to a sidewall 50B of the second metal sub-layer 52, and upper and lower protrusions and the sidewall 50B of the second metal layer form an inwardly recessed structure, so that the second partition layer 50 forms a second "⊥"-shaped structure.

In an exemplary implementation mode, a width LT1 of the third conductive sub-layer 43 may be smaller than a width LB1 of the first conductive sub-layer 41, and an orthographic projection of the third conductive sub-layer 43 on the base substrate may be within a range of an orthographic projection of the first conductive sub-layer 41 on the base substrate.

In an exemplary implementation mode, a width LT1 of the third conductive sub-layer 43 may be equal to a width of the first upper bottom in the second conductive sub-layer 42, and a width LB1 of the first conductive sub-layer 41 may be equal to a width of the first lower bottom in the second conductive sub-layer 42.

In an exemplary implementation mode, a width LT2 of the third metal sub-layer 53 may be less than or equal to a width LB2 of the first metal sub-layer 51, and an orthographic projection of the third metal sub-layer 53 on the base substrate may be within a range of an orthographic projection of the first metal sub-layer 51 on the base substrate.

In an exemplary implementation mode, a width LM2 of the second metal sub-layer 52 may be smaller than a width LB2 of the first metal sub-layer 51 and a width LT2 of the third metal sub-layer 53 at the same time, and an orthographic projection of the second metal sub-layer 52 on the base substrate may be within a range of an orthographic projection of the first metal sub-layer 51 and a range of an orthographic projection of the third metal sub-layer 53 on the base substrate at the same time.

In an exemplary implementation mode, a width LT2 of the third metal sub-layer 53 may be smaller than a width LB1 of the first conductive sub-layer 41, and an orthographic projection of the third metal sub-layer 53 on the base substrate may be within a range of an orthographic projection of the first conductive sub-layer 41 on the base substrate.

In an exemplary implementation mode, a width LB2 of the first metal sub-layer 51 may be equal to a width LT1 of the third conductive sub-layer 43, and an orthographic projection of the first metal sub-layer 51 on the base substrate and an orthographic projection of the third conductive sub-layer 43 on the base substrate may be substantially the same.

In an exemplary implementation mode, a width LB1 of the first conductive sub-layer 41 may be about 5.0 μm to 5.8 μm, a width LB1 of the third conductive sub-layer 43 may be about 4.8 μm to 5.6 μm, a width LB2 of the first metal sub-layer 51 may be about 4.6 μm to 5.4 μm, a width LM2 of the second metal sub-layer 52 may be about 3.8 μm to 4.6 μm, and a width LT2 of the third metal sub-layer 53 may be about 4.4 μm to 5.2 μm. For example, the width LB1 of the first conductive sub-layer 41 may be about 5.4 μm, the width LT1 of the third conductive sub-layer 43 may be about 5.2 μm, the width LB2 of the first metal sub-layer 51 may be about 5.0 μm, the width LM2 of the second metal sub-layer 52 may be about 4.2 μm, and the width LT2 of the third metal sub-layer 53 may be about 4.8 μm.

In an exemplary implementation mode, the preparation process of the display substrate of this exemplary embodiment is substantially the same as that of the foregoing embodiments, and includes forming a transistor structure layer, a first planarization layer, a fourth conductive layer, a second planarization layer, an anode conductive layer, a pixel definition layer, an organic emitting layer, a cathode, and an encapsulation structure layer. A difference is that, a first partition layer 40 with a trapezoidal cross-section is formed during patterning of a third conductive thin film. A first planarization thin film is used for protecting the first partition layer 40 when forming a pattern of the first planarization layer. During patterning of the second planarization layer and the anode conductive layer, under a condition of protecting the first partition layer 40, a second partition layer 50 with a "⊥"-shaped structure is formed, and finally a partition dam structure with a lower trapezoidal structure and an upper "⊥"-shaped structure is formed.

In this exemplary embodiment, not only a partition effect of the partition dam structure is effectively improved by increasing a height of the partition dam structure, but also a partition dam is formed through a combination of a trapezoidal structure and a "⊥"-shaped structure. An upper "⊥"-shaped structure achieves partition of an organic light emitting material, and a lower trapezoidal structure achieves good bonding of an encapsulation material layer, so that the encapsulation material layer may better cover a sidewall of the partition dam, which may not only effectively avoid formation of a void hole on the sidewall of the partition dam, but also effectively avoid a crack appearing in the encapsulation material layer, thereby encapsulation failure can be effectively avoided, and a production yield and product reliability of the display substrate can be improved.

Figure 27:
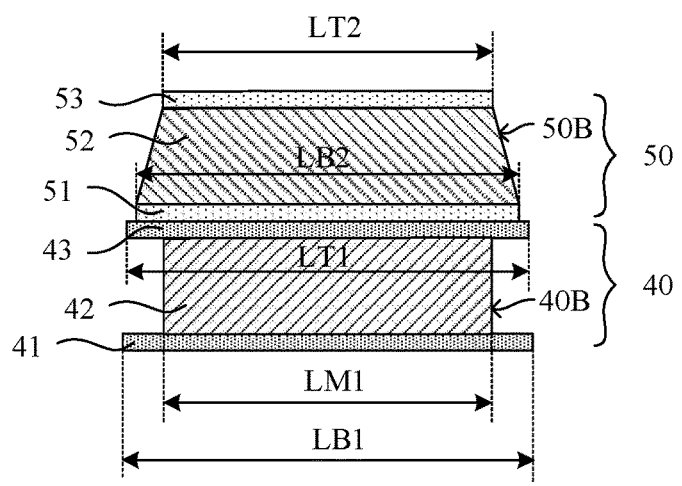
FIG. 27 is a schematic diagram of a structure of yet another partition dam according to an exemplary embodiment of the present disclosure.

FIG. 27 is a schematic diagram of a structure of yet another partition dam according to an exemplary embodiment of the present disclosure. As shown in FIG. 27, the partition dam of this exemplary embodiment may include a first partition layer 40 and a second partition layer 50 that are stacked. The first partition layer 40 may include a first conductive sub-layer 41, a second conductive sub-layer 42, and a third conductive sub-layer 43 that are stacked, and the second partition layer 50 may include a first metal sub-layer 51, a second metal sub-layer 52, and a third metal sub-layer 53 that are stacked. A cross-sectional shape of the first partition layer 40 has a "⊥"-shaped structure, and a cross-sectional shape of the second partition layer 50 has a trapezoidal structure. The "⊥"-shaped structure and the trapezoidal structure disposed on a side of the "⊥"-shaped structure away from a base together constitute a partition dam structure in which an upper trapezoidal structure and a lower "⊥"-shaped structure are stacked.

In an exemplary implementation mode, the first conductive sub-layer 41 and the third conductive sub-layer 43 have protrusions with respect to a sidewall 40B of the second conductive sub-layer 42, and upper and lower protrusions and the sidewall 40B of the second sub-layer form an inwardly recessed structure so that the first partition layer 40 forms a first "⊥"-shaped structure.

In an exemplary implementation mode, a cross-sectional shape of the second metal sub-layer 52 is a trapezoid, including a second upper bottom on a side away from a base substrate, a second lower bottom on a side close to the base substrate, and a second sidewall 50B connected between the second upper bottom and the second lower bottom. In an exemplary implementation mode, the second sidewall 50B may be in a shape of a straight line or may be in a shape of an arc line.

In an exemplary implementation mode, a width LT1 of the third conductive sub-layer 43 may be less than or equal to a width LB1 of the first conductive sub-layer 41, and an orthographic projection of the third conductive sub-layer 43 on a base substrate may be within a range of an orthographic projection of the first conductive sub-layer 41 on the base substrate.

In an exemplary implementation mode, a width LM1 of the second conductive sub-layer 42 may be smaller than a width LB1 of the first conductive sub-layer 41 and a width LT1 of the third conductive sub-layer 43 at the same time, and an orthographic projection of the second conductive sub-layer 42 on the base substrate may be within a range of an orthographic projection of the first conductive sub-layer 41 and a range of an orthographic projection of the third conductive sub-layer 43 on the base substrate at the same time.

In an exemplary implementation mode, a width LT2 of the third metal sub-layer 53 may be smaller than a width LB2 of the first metal sub-layer 51, and an orthographic projection of the third metal sub-layer 53 on the base substrate may be within a range of an orthographic projection of the first metal sub-layer 51 on the base substrate.

In an exemplary implementation mode, a width LT2 of the third metal sub-layer 53 may be equal to a width of the second upper bottom in the second metal sub-layer 52, and a width LB2 of the first metal sub-layer 51 may be equal to a width of the second lower bottom in the second metal sub-layer 52.

In an exemplary implementation mode, a width LB2 of the first metal sub-layer 51 may be less than or equal to a width LT1 of the third conductive sub-layer 43, and an orthographic projection of the first metal sub-layer 51 on the base substrate and an orthographic projection of the third conductive sub-layer 43 on the base substrate may be substantially the same.

In exemplary embodiments, a width LB1 of the first conductive sub-layer 41 may be about 5.0 μm to 5.8 μm, a width LM1 of the second conductive sub-layer 42 may be about 4.6 μm to 5.4 μm, a width LB1 of the third conductive sub-layer 43 may be about 4.8 μm to 5.6 μm, a width LB2 of the first metal sub-layer 51 may be about 4.6 μm to 5.4 μm, and a width LT2 of the third metal sub-layer 53 may be about 4.4 μm to 5.2 μm. For example, the width LB1 of the first conductive sub-layer 41 may be about 5.4 μm, the width LM1 of the second conductive sub-layer 42 may be about 5.0 μm, the width LT1 of the third conductive sub-layer 43 may be about 5.2 μm, the width LB2 of the first metal sub-layer 51 may be about 5.0 μm, and the width LT2 of the third metal sub-layer 53 may be about 4.8 μm.

In an exemplary implementation mode, the preparation process of the display substrate of this exemplary embodiment is substantially the same as that of the foregoing embodiments, and includes forming a transistor structure layer, a first planarization layer, a fourth conductive layer, a second planarization layer, an anode conductive layer, a pixel definition layer, an organic emitting layer, a cathode, and an encapsulation structure layer. A difference is that, during patterning of the first planarization layer, side etching of the first partition layer 40 is jointly completed using development and a wet etching process to form the first partition layer 40 with a "⊥"-shaped structure. During patterning of the second planarization layer and patterning of the anode conductive layer, the second partition layer 50 is always covered and protected by photoresist without side etching, and finally a partition dam structure with an upper trapezoidal structure and a lower "⊥"-shaped structure that are stacked is formed.

In this exemplary embodiment, not only a partition effect of the partition dam structure is effectively improved by increasing a height of the partition dam structure, but also a partition dam is formed through a combination of a trapezoidal structure and a "⊥"-shaped structure. A lower "⊥"-shaped structure achieves partition of an organic light emitting material, and an upper trapezoidal structure achieves good bonding of an encapsulation material layer, so that the encapsulation material layer may better cover a sidewall of the partition dam, which may not only effectively avoid formation of a void hole on the sidewall of the partition dam, but also effectively avoid a crack appearing in the encapsulation material layer, thereby encapsulation failure can be effectively avoided, and a production yield and product reliability of the display substrate can be improved.

The structure of the display substrate and the preparation process thereof of the exemplary embodiment of the present disclosure are merely illustrative. In an exemplary implementation mode, a corresponding structure may be changed and a patterning process may be increased or decreased according to actual needs, which is not limited in the present disclosure.

In an exemplary implementation mode, the display substrate of the present disclosure may be applied to a display apparatus with a pixel drive circuit, such as an OLED, a quantum dot display (QLED), a light emitting diode display (Micro LED or Mini LED), or a Quantum Dot Light Emitting Diode display (QDLED), which is not limited in the present disclosure.

The present disclosure further provides a preparation method of a display substrate. In an exemplary implementation mode, the display substrate may include a display region and at least one hole region located in the display region, the hole region includes a function hole and a partition region surrounding the function hole; and the preparation method may include: forming at least one partition dam surrounding the function hole in the partition region; wherein the partition dam includes a first partition layer and a second partition layer which are stacked, at least one partition layer includes a second sub-layer and a third sub-layer disposed on a side of the second sub-layer away from a base substrate, the third sub-layer has a protrusion with respect to a sidewall of the second sub-layer, the protrusion and the sidewall of the second sub-layer form an inwardly recessed structure.

The present disclosure further provides a display apparatus including the display substrate of the aforementioned embodiments. The display apparatus may be any product or component with a display function, such as a mobile phone, a tablet computer, a television, a display, a laptop computer, a digital photo frame, or a navigator.

Although the implementation modes disclosed in the present disclosure are as above, the described contents are only implementation modes used for convenience of understanding the present disclosure and are not intended to limit the present disclosure. Any skilled in the art to which the present disclosure pertains, without departing from the spirit and scope disclosed in the present disclosure, may make any modification and change in a form and details of implementation. However, the scope of patent protection of the present application should still be subject to the scope defined by the appended claims.

The invention claimed is:

1. A display substrate, comprising a display region and at least one hole region located in the display region, wherein the hole region comprises a function hole and a partition region surrounding the function hole, and the partition region is provided with at least one partition dam surrounding the function hole; the partition dam comprises a first partition layer disposed on a base substrate and a second partition layer disposed on a side of the first partition layer away from the base substrate, at least one partition layer of the first partition layer and the second partition layer comprises a second sub-layer and a third sub-layer disposed on a side of the second sub-layer away from the base substrate, the third sub-layer has a protrusion with respect to a sidewall of the second sub-layer, the protrusion and the sidewall of the second sub-layer form an inwardly recessed structure, wherein the at least one partition layer further comprises a first sub-layer, and the second sub-layer is disposed on a side of the first sub-layer away from the base substrate, and wherein the first partition layer comprises a first conductive sub-layer, a second conductive sub-layer disposed on a side of the first conductive sub-layer away from the base substrate, and a third conductive sub-layer disposed on a side of the second conductive sub-layer away from the base substrate; along a direction away from the function hole, a width of the second conductive sub-layer is smaller than each of widths of the first conductive sub-layer and the third conductive sub-layer, an orthographic projection of the second conductive sub-layer on the base substrate is within each of a range of an orthographic projection of the first conductive sub-layer and a range of an orthographic projection of the third conductive sub-layer on the base substrate, the first conductive sub-layer and the third conductive sub-layer have protrusions with respect to a sidewall of the second conductive sub-layer, and the protrusions and the sidewall of the second conductive sub-layer form an inwardly recessed structure.

2. The display substrate according to claim 1, wherein the second partition layer comprises a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; along the direction away from the function hole, a width of the second metal sub-layer is smaller than each of widths of the first metal sub-layer and the third metal sub-layer, an orthographic projection of the second metal sub-layer on the base substrate is within each of a range of an orthographic projection of the first metal sub-layer and a range of an orthographic projection of the third metal sub-layer on the base substrate, the first metal sub-layer and the third metal sub-layer have protrusions with respect to a sidewall of the second metal sub-layer, and the protrusions and the sidewall of the second metal sub-layer form an inwardly recessed structure.

3. The display substrate according to claim 2, wherein along the direction away from the function hole, a width of the first metal sub-layer is smaller than a width of the first conductive sub-layer, and an orthographic projection of the first metal sub-layer on the base substrate is within a range of an orthographic projection of the first conductive sub-layer on the base substrate.

4. The display substrate according to claim 2, wherein along the direction away from the function hole, the width of the second metal sub-layer is smaller than the width of the second conductive sub-layer, and the orthographic projection of the second conductive sub-layer on the base substrate is within a range of an orthographic projection of the second metal sub-layer on the base substrate.

5. The display substrate according to claim 2, wherein along the direction away from the function hole, a width of the third metal sub-layer is smaller than a width of the third conductive sub-layer, and an orthographic projection of the third conductive sub-layer on the base substrate is within a range of an orthographic projection of the third metal sub-layer on the base substrate.

6. The display substrate according to claim 2, wherein along the direction away from the function hole, a width of the third metal sub-layer is less than or equal to a width of the first metal sub-layer, and an orthographic projection of the third metal sub-layer on the base substrate is within a range of an orthographic projection of the first metal sub-layer on the base substrate; a width of the third conductive sub-layer is less than or equal to a width of the first conductive sub-layer, and an orthographic projection of the third conductive sub-layer on the base substrate is within a range of an orthographic projection of the first conductive sub-layer on the base substrate; the width of the first metal sub-layer is less than or equal to the width of the third conductive sub-layer, and the orthographic projection of the first metal sub-layer on the base substrate is within a range of the orthographic projection of the third conductive sub-layer on the base substrate.

7. The display substrate according to claim 2, wherein along the direction away from the function hole, a width of the third metal sub-layer is greater than a width of the first metal sub-layer, and an orthographic projection of the first metal sub-layer on the base substrate is within a range of an orthographic projection of the third metal sub-layer on the base substrate; a width of the third conductive sub-layer is smaller than a width of the first conductive sub-layer, and an orthographic projection of the third conductive sub-layer on the base substrate is within a range of an orthographic projection of the first conductive sub-layer on the base substrate; the width of the first metal sub-layer is equal to the width of the third conductive sub-layer, and the orthographic projection of the first metal sub-layer on the base substrate is substantially overlapped with the orthographic projection of the third conductive sub-layer on the base substrate.

8. The display substrate according to claim 2, wherein a distance between an edge of the third metal sub-layer and the base substrate is less than a distance between a surface of the second metal sub-layer on a side away from the base substrate and the base substrate.

9. The display substrate according to claim 1, wherein the second partition layer comprises a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; a cross-sectional shape of the second metal sub-layer is a second trapezoid, the second trapezoid comprises a second lower bottom on a side close to the base substrate and a second upper bottom on a side away from the base substrate; along the direction away from the function hole, a width of the second upper bottom is smaller than a width of the second lower bottom, an orthographic projection of the second upper bottom on the base substrate is within a range of an orthographic projection of the second lower bottom on the base substrate; a width of the third metal sub-layer is less than or equal to the width of the second upper bottom, and an orthographic projection of the third metal sub-layer on the base substrate is within a range of the orthographic projection of the second upper bottom on the base substrate; the width of the second lower bottom is less than or equal to a width of the first metal sub-layer, and the orthographic projection of the second lower bottom on the base substrate is within a range of an orthographic projection of the first metal sub-layer on the base substrate.

10. The display substrate according to claim 9, wherein the width of the first metal sub-layer is less than or equal to a width of the third conductive sub-layer, and the orthographic projection of the first metal sub-layer on the base substrate is within a range of an orthographic projection of the third conductive sub-layer on the base substrate.

11. The display substrate according to claim 1, wherein the second partition layer comprises a first metal sub-layer disposed on a side of the first partition layer away from the base substrate, a second metal sub-layer disposed on a side of the first metal sub-layer away from the base substrate, and a third metal sub-layer disposed on a side of the second metal sub-layer away from the base substrate; along a direction away from the function hole, a width of the second metal sub-layer is smaller than each of widths of the first metal sub-layer and the third metal sub-layer, an orthographic projection of the second metal sub-layer on the base substrate is within each of a range of an orthographic projection of the first metal sub-layer and a range of an orthographic projection of the third metal sub-layer on the base substrate, the first metal sub-layer and the third metal sub-layer have protrusions with respect to a sidewall of the second metal sub-layer, and the protrusions and the sidewall of the second metal sub-layer form an inwardly recessed structure.

12. The display substrate according to claim 11, wherein the first partition layer comprises a first conductive sub-layer, a second conductive sub-layer disposed on a side of the first conductive sub-layer away from the base substrate, and a third conductive sub-layer disposed on a side of the second conductive sub-layer away from the base substrate; a cross-sectional shape of the second conductive sub-layer is a first trapezoid, wherein the first trapezoid comprises a first lower bottom on a side close to the base substrate and a first upper bottom on a side away from the base substrate; along the direction away from the function hole, a width of the first upper bottom is less than a width of the first lower bottom, an orthographic projection of the first upper bottom on the base substrate is within a range of an orthographic projection of the first lower bottom on the base substrate; a width of the third conductive sub-layer is less than or equal to the width of the first upper bottom, and an orthographic projection of the third conductive sub-layer on the base substrate is within a range of the orthographic projection of the first upper bottom on the base substrate; the width of the first lower bottom is less than or equal to a width of the first conductive sub-layer, and the orthographic projection of the first lower bottom on the base substrate is within a range of an orthographic projection of the first conductive sub-layer on the base substrate.

13. The display substrate according to claim 12, wherein a width of the first metal sub-layer is less than or equal to the width of the third conductive sub-layer, and an orthographic projection of the first metal sub-layer on the base substrate is within a range of the orthographic projection of the third conductive sub-layer on the base substrate.

14. The display substrate according to claim 11, wherein the display region comprises a first insulation layer, a semiconductor layer, a second insulation layer, a first conductive layer, a third insulation layer, a second conductive layer, a fourth insulation layer, a third conductive layer, a first planarization layer, a fourth conductive layer, and a second planarization layer disposed in sequence on the base substrate, the first partition layer is disposed in a same layer as the third conductive layer, and the second partition layer is disposed in a same layer as the fourth conductive layer.

15. The display substrate according to claim 1, wherein the display region comprises a first insulation layer, a semiconductor layer, a second insulation layer, a first conductive layer, a third insulation layer, a second conductive layer, a fourth insulation layer, a third conductive layer, a first planarization layer, a fourth conductive layer, and a second planarization layer disposed in sequence on the base substrate, the first partition layer is disposed in a same layer as the third conductive layer, and the second partition layer is disposed in a same layer as the fourth conductive layer.

16. A display apparatus, comprising the display substrate according to claim 1.

17. A preparation method of a display substrate, wherein the display substrate comprises a display region and at least one hole region located in the display region, the hole region comprises a function hole and a partition region surrounding the function hole; the preparation method comprises:

forming at least one partition dam surrounding the function hole in the partition region; wherein the partition dam comprises a first partition layer and a second partition layer which are stacked, at least one partition layer of the first partition layer and the second partition layer comprises a second sub-layer and a third sub-layer disposed on a side of the second sub-layer away from a base substrate, the third sub-layer has a protrusion with respect to a sidewall of the second sub-layer, the protrusion and the sidewall of the second sub-layer form an inwardly recessed structure, wherein the at least one partition layer further comprises a first sub-layer, and the second sub-layer is disposed on a side of the first sub-layer away from the base substrate, and wherein the first partition layer comprises a first conductive sub-layer, a second conductive sub-layer disposed on a side of the first conductive sub-layer away from the base substrate, and a third conductive sub-layer disposed on a side of the second conductive sub-layer away from the base substrate; along a direction away from the function hole, a width of the second conductive sub-layer is smaller than each of widths of the first conductive sub-layer and the third conductive sub-layer, an orthographic projection of the second conductive sub-layer on the base substrate is within each of a range of an orthographic projection of the first conductive sub-layer and a range of an orthographic projection of the third conductive sub-layer on the base substrate, the first conductive sub-layer and the third conductive sub-layer have protrusions with respect to a sidewall of the second conductive sub-layer, and the protrusions and the sidewall of the second conductive sub-layer form an inwardly recessed structure.

* * * * *